United States Patent
Huang et al.

(10) Patent No.: US 10,886,147 B1
(45) Date of Patent: Jan. 5, 2021

(54) PACKAGE STRUCTURE AND METHOD FOR FORMING THE SAME

(71) Applicant: Taiwan Semiconductor Manufacturing Co., Ltd., Hsinchu (TW)

(72) Inventors: Kuan-Yu Huang, Taipei (TW); Sung-Hui Huang, Dongshan Township, Yilan County (TW); Shang-Yun Hou, Jubei (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/571,786

(22) Filed: Sep. 16, 2019

(51) Int. Cl.
*H01L 21/48* (2006.01)
*H01L 21/56* (2006.01)

(52) U.S. Cl.
CPC ........ *H01L 21/486* (2013.01); *H01L 21/4853* (2013.01); *H01L 21/4857* (2013.01); *H01L 21/568* (2013.01)

(58) Field of Classification Search
CPC ............. H01L 2224/97; H01L 2224/81; H01L 2224/131; H01L 2224/73204; H01L 25/50; H01L 2224/12105
See application file for complete search history.

(56) References Cited

U.S. PATENT DOCUMENTS

| | | | |
|---|---|---|---|
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2* | 5/2017 | Chen | ................... H01L 23/5386 |
| 9,735,131 B2 | 8/2017 | Su et al. | |
| 2019/0051621 A1* | 2/2019 | Liu | ................... H01L 23/49838 |

* cited by examiner

*Primary Examiner* — Jaehwan Oh
(74) *Attorney, Agent, or Firm* — McClure, Qualey & Rodack, LLP

(57) ABSTRACT

A method for forming the package structure is provided. The method includes forming a die structure over a first surface of a first substrate, and forming a plurality of electrical connectors below a second surface of the first substrate. The method also includes forming a first protruding structure below the second surface of the first substrate, and the electrical connectors are surrounded by the first protruding structure. The method further includes forming a second protruding structure over a second substrate, and bonding the first substrate to the second substrate. The electrical connectors are surrounded by the second protruding structure, and the first protruding structure does not overlap with the second protruding structure.

20 Claims, 31 Drawing Sheets

PACKAGE STRUCTURE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

New packaging technologies, such as package on package (PoP), have begun to be developed, in which a top package with a device die is bonded to a bottom package, with another device die. By adopting the new packaging technologies, various packages with different or similar functions are integrated together.

Although existing package structures and methods of fabricating package structure have generally been adequate for their intended purpose, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1M' shows a cross-sectional representation of a package structure, in accordance with some embodiments of the disclosure.

FIG. 2C' shows a top-view representation of the second protruding structure and the third protruding structure, in accordance with some embodiments of the disclosure.

FIG. 3E' shows a cross-sectional representation of a package structure, in accordance with some embodiments of the disclosure.

FIG. 4B' shows a top-view representation of the second protruding structure and the third protruding structure, in accordance with some embodiments of the disclosure.

DETAILED DESCRIPTION

Figure 1A:
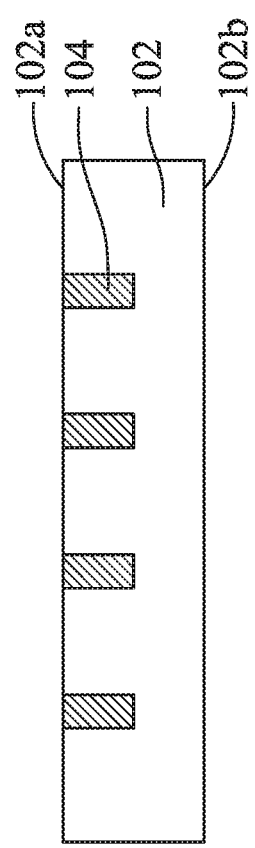
FIGS. 1A-1M show cross-sectional representations of various stages of forming a package structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, so that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments for a semiconductor device structure and method for forming the same are provided. FIGS. 1A-1M show cross-sectional representations of various stages of forming a package structure 100a, in accordance with some embodiments of the disclosure. The package structure may be a chip-on-wafer-on-substrate (CoWoS) package or another suitable package. The package structure includes a die structure formed on a first substrate, and the first substrate bonded to a second substrate. In order to prevent warpage of the first substrate, a protruding structure is formed below the first substrate, and another protruding structure is formed over the second substrate. The first protruding structure is configured to provide mechanical and structural support of the substrate. The first protruding structure and the second protruding structure are between the first substrate and the second substrate.

Referring to FIG. 1A, a first substrate 102 is provided. The first substrate 102 includes a first surface 102a and a second surface 102b. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

A number of conductive structures 104 are formed in the first substrate 102. The conductive structures 104 extend from the first surface 102a of the first substrate 102 towards the second surface 102b of the first substrate 102.

In some embodiments, the conductive structures 104 are formed by forming a number of trenches (not shown) which extend from the first surface 102a of the first substrate 102. Afterwards, the conductive structure 104 is formed in each of the trenches. In some embodiments, a barrier layer (not shown) is formed in the trenches before forming the conductive structure 104.

Figure 1B:
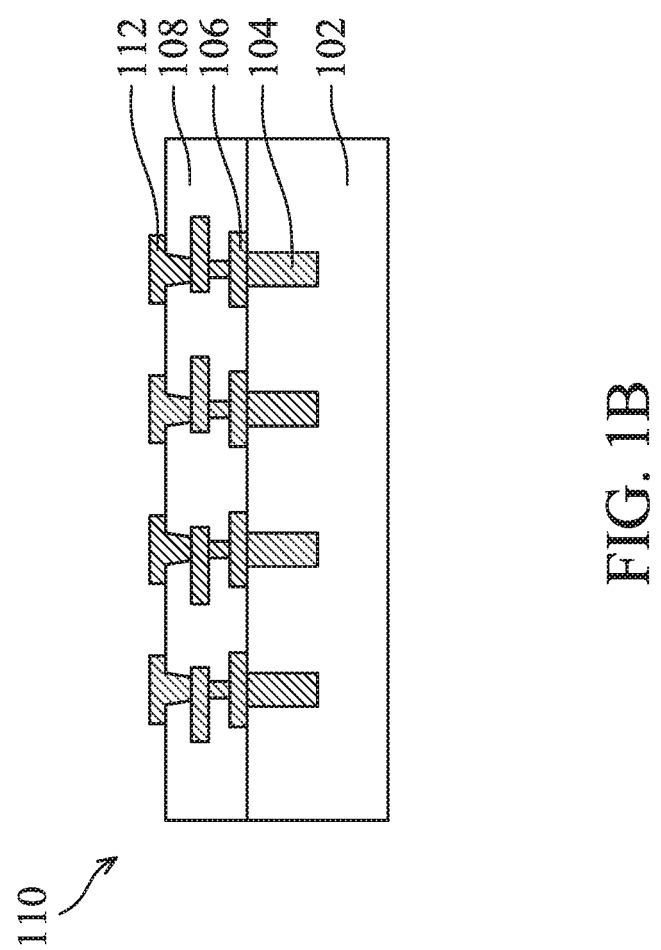

Afterwards, as shown in FIG. 1B, an interconnect structure 110 is formed over the conductive structures 104 and the first substrate 102. The interconnect structure 110 may be used as a redistribution (RDL) structure for routing. The interconnect structure 110 includes multiple conductive layers 106 and conductive pads 112 formed in multiple dielectric layers 108. In some embodiments, the conductive pads 112 are exposed at or protruding from the top surface of the top of the dielectric layers 108 to serve as bonding pads.

The dielectric layers 108 may be made of or include one or more polymer materials. The polymer material(s) may include polybenzoxazole (PBO), polyimide (PI), one or more other suitable polymer materials, or a combination thereof. In some embodiments, some or all of the dielectric layers 108 are made of or include dielectric materials other than polymer materials. The dielectric material may include silicon oxide, silicon carbide, silicon nitride, silicon oxynitride, one or more other suitable materials, or a combination thereof.

The conductive layers 106 and the conductive pads 112 may be made of copper (Cu), copper alloy, aluminum (Al), aluminum alloy, tungsten (W), tungsten alloy, titanium (Ti), titanium alloy, tantalum (Ta) or tantalum alloy. In some embodiments, the conductive layers 106 and the conductive pads 112 are formed by an electroplating, electroless plating, printing, a chemical vapor deposition (CVD) process, or a physical vapor deposition (PVD) process.

Figure 1C:
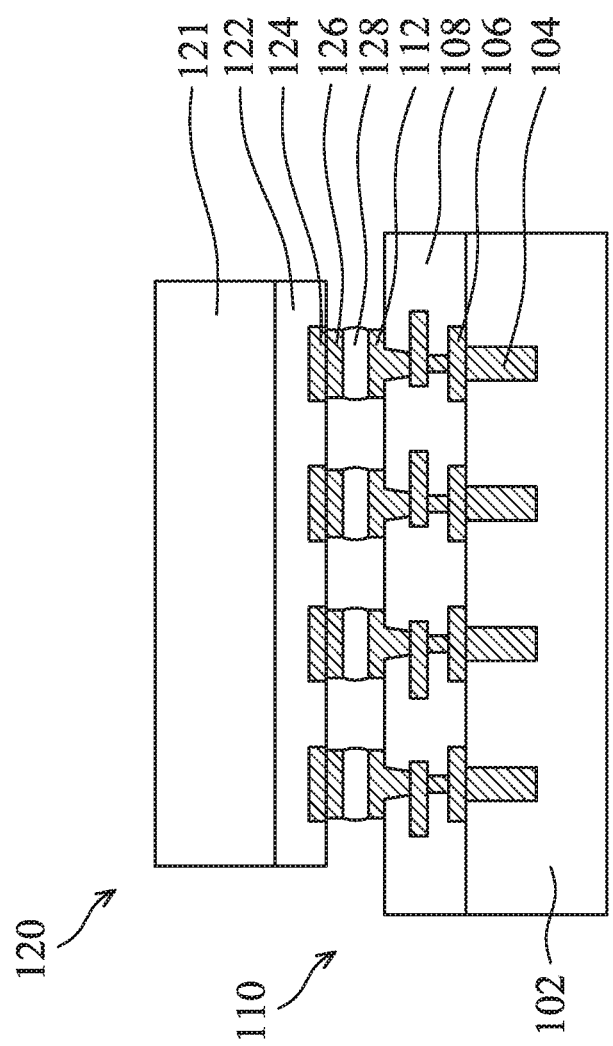

Afterwards, as shown in FIG. 1C, a semiconductor die 120 is formed over the first substrate 102, in accordance with some embodiments of the disclosure. The semiconductor die 120 includes a substrate 121 and an interconnect structure 122 over the substrate 121. The interconnect structure 122 of the semiconductor die 120 includes a number of conductive layers 124.

In some embodiments, the semiconductor die 120 is sawed from a wafer, and may be a "known-good-die". The semiconductor die 120 may be a system-on-chip (SoC) chip or memory die. In some other embodiments, the semiconductor die 120 is a system on integrated circuit (SoIC) device that includes two or more chips with integrated functions. In some embodiments, the memory die includes a static random access memory (SRAM) device, a dynamic random access memory (DRAM) device, a high bandwidth memory (HBM) or another memory dies. The number of semiconductor die 120 is not limited to one, and the number can be adjusted according to actual application.

In some embodiments, a number of conductive pads 126 are formed below the conductive layers 124 of the semiconductor die 120, and each of the conductive pads 126 is bonded to each of the conductive pads 112 through a number of conductive connectors 128.

The conductive pads 126 are made of metal materials, such as copper (Cu), copper alloy, aluminum (Al), aluminum alloy, tungsten (W), tungsten alloy, titanium (Ti), titanium alloy, tantalum (Ta) or tantalum alloy. In some embodiments, the conductive pad 126 is formed by an electroplating, electroless plating, printing, a chemical vapor deposition (CVD) process, or a physical vapor deposition (PVD) process.

The conductive connector 128 is made of solder materials, such as tin (Sn), tin-silver (SnAg), tin-lead (SnPb), tin-copper (SnCu), tin-silver-copper (SnAgCu), tin-silver-zinc (SnAgZn), tin-zinc (SnZn), tin-bismuth-indium (SnBiIn), tin-indium (SnIn), tin-gold (SnAu), tin-zinc-indium (SnZnIn), tin-silver-Antimony (SnAgSb) or another applicable material. In some embodiments, the conductive connector 128 is formed by electroplating, electroless plating, printing, a chemical vapor deposition (CVD) process, or a physical vapor deposition (PVD) process.

Figure 1D:
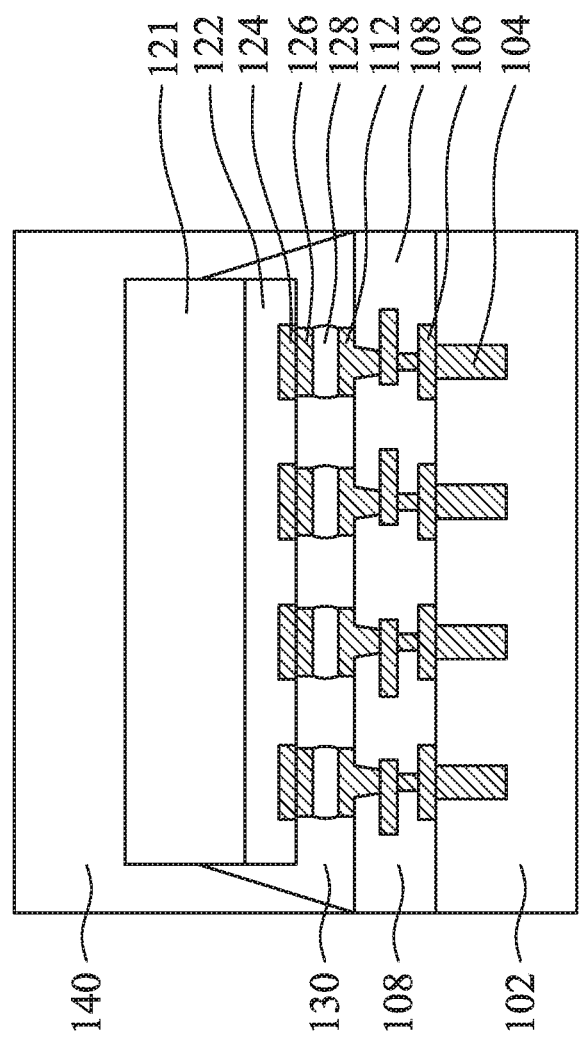

Next, as shown in FIG. 1D, an underfill layer 130 is formed between the semiconductor die 120 and the interconnect structure 110, in accordance with some embodiments of the disclosure. The underfill layer 130 surrounds and protects the conductive connectors 128. In some embodiments, the underfill layer 130 is in direct contact with the conductive connectors 128.

In some embodiments, the underfill layer 130 is made of or includes a polymer material. The underfill layer 130 may include an epoxy-based resin. In some embodiments, the underfill layer 130 includes fillers dispersed in the epoxy-based resin.

In some embodiments, the formation of the underfill layer 130 involves an injecting process, a spin-on process, a dispensing process, a film lamination process, an application process, one or more other applicable processes, or a combination thereof. In some embodiments, a thermal curing process is used during the formation of the underfill layer 130.

Afterwards, a package layer 140 is formed over the underfill layer 130. There is an interface between the underfill layer 130 and the package layer 140, and the interface is lower than the top surface of the semiconductor die 120. The package layer 140 surrounds and protects the semiconductor die 120. In some embodiments, the package layer 140 is in direct contact with portions of the semiconductor die 120.

The package layer 140 is made of a molding compound material. The molding compound material may include a polymer material, such as an epoxy-based resin with fillers dispersed therein. In some embodiments, a liquid molding compound material is applied over the semiconductor die 120. The liquid molding compound material may flow into a space between the semiconductor die 120. A thermal process is then used to cure the liquid molding compound material and to transform it into the package layer 140.

Figure 1E:
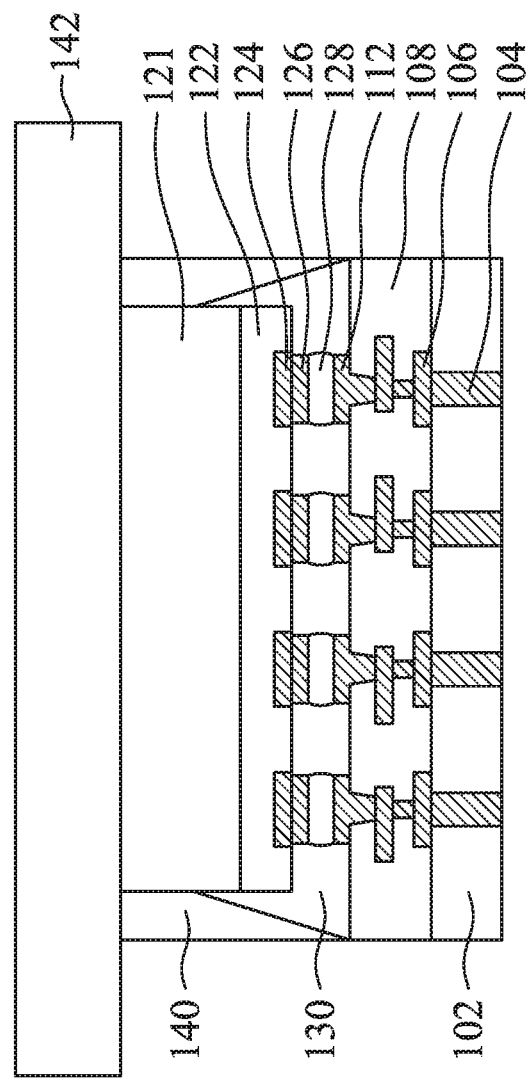

Afterwards, as shown in FIG. 1E, a portion of the package layer 140 is removed, in accordance with some embodiments of the disclosure. As a result, the top surface of the semiconductor die 120 is exposed. The top surface of the semiconductor die 120 is substantially level with the top surface of the package layer 136. Where applicable, the term "substantially" may also relate to 90% or higher, such as 95% or higher, especially 99% or higher, including 100%.

In some embodiments, the package layer 140 is thinned using a planarization process. The planarization process may include a chemical mechanical polishing (CMP) process, a grinding process, an etching process, another applicable process, or a combination thereof.

Subsequently, the package layer 140 is attached to a carrier substrate 142. In some embodiments, the carrier substrate 142 is used as a temporary substrate. The temporary substrate provides mechanical and structural support during subsequent processing steps, such as those described in more detail later. The carrier substrate 142 is made of a semiconductor material, ceramic material, polymer material, metal material, another suitable material, or a combination thereof. In some embodiments, the carrier substrate 142 is a glass substrate. In some other embodiments, the carrier substrate 142 is a semiconductor substrate, such as a silicon wafer.

Afterwards, the first substrate 102 is thinned using the carrier substrate 142 as support. In some embodiments, the first substrate 102 is thinned from the second surface 102b until the conductive structures 104 are exposed. In some embodiments, the conductive structures 104 become exposed and penetrate through the thinned first substrate 102. As a result, a through via structure 144 is formed in the first substrate 102. In some embodiments, the through via structure 144 is a through substrate via (TSV). In some other embodiments, the through via structure 144 may be referred to as through-silicon via.

Figure 1F:
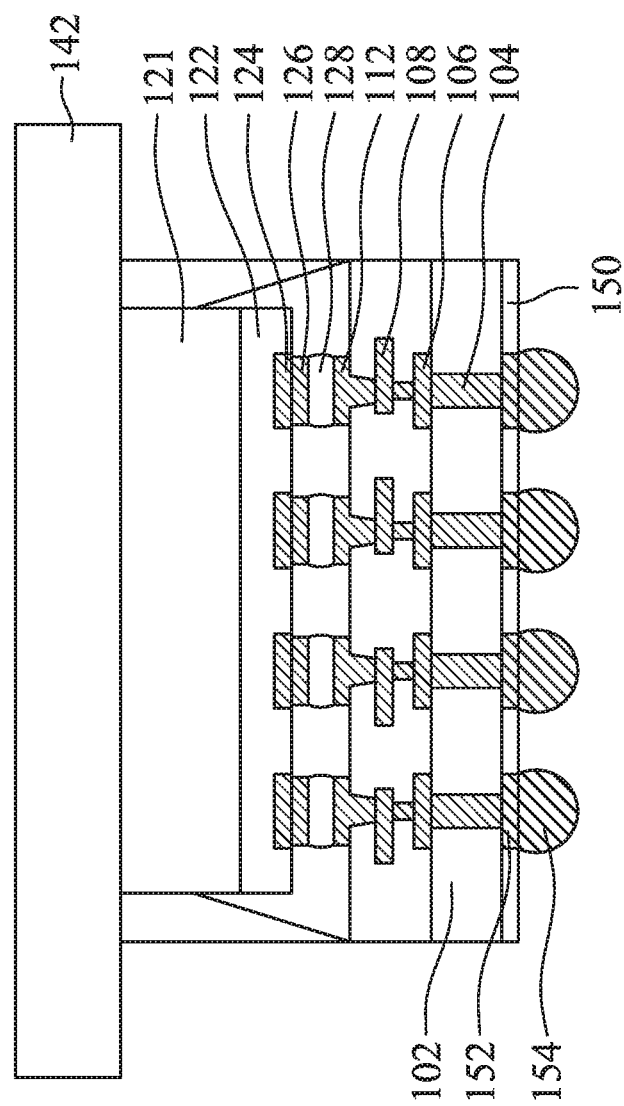

Afterwards, as shown in FIG. 1F, a passivation layer 150 is formed below the second surface 102b of the first substrate 102, and a conductive pad 152 is formed in the passivation layer 150, in accordance with some embodiments of the disclosure. A conductive connector 154 is formed below the conductive pad 152. The conductive connector 154 is electrically connected to through via structure 144 by the conductive pad 152.

The passivation layer 150 is made of poly(p-phenylene-2,6-benzoxazole) (PBO), benzocyclobutene (BCB), silicone, acrylates, siloxane, another suitable material, or a combination thereof. In some other embodiments, the passivation layer 150 is made of non-organic materials. The non-organic materials include silicon oxide, un-doped silicate glass, silicon oxynitride, silicon nitride, silicon carbide, another suitable material, or a combination thereof. In some embodiments, the passivation layer 150 is formed by a deposition process, such as a physical vapor deposition (PVD) process, a chemical vapor deposition (CVD) process, or another applicable process.

The conductive pad 152 is made of metal materials, such as copper (Cu), copper alloy, aluminum (Al), aluminum alloy, tungsten (W), tungsten alloy, titanium (Ti), titanium alloy, tantalum (Ta) or tantalum alloy. The conductive connector 154 is made of a metal layer, such as copper, copper alloy, nickel, nickel alloy, aluminum, aluminum alloy, tin, tin alloy, lead, lead alloy, silver, silver alloy or a combination thereof. In some embodiments, the conductive connector 154 is formed by a plating process, such as an electrochemical plating process or an electroless process.

Figure 1G:
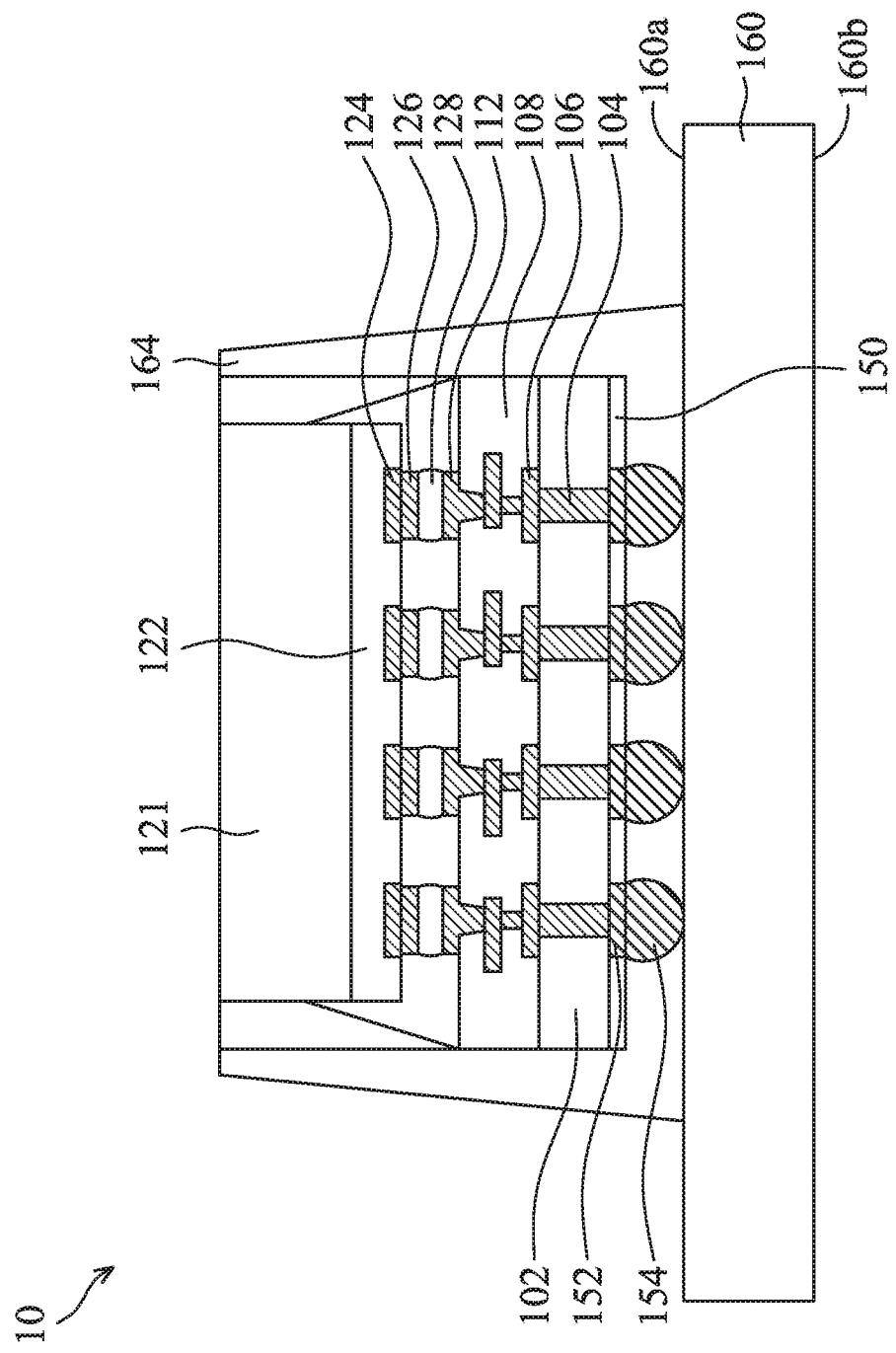

Next, as shown in FIG. 1G, the carrier substrate 142 is removed to form a die structure 10, and the die structure 10 is formed over a second substrate 160 by the conductive connector 154, in accordance with some embodiments of the disclosure. The second substrate 160 has a first surface 160a and a second surface 160b. The die structure 10 is formed over the first surface 160a of the second substrate 160.

Figure 1H:
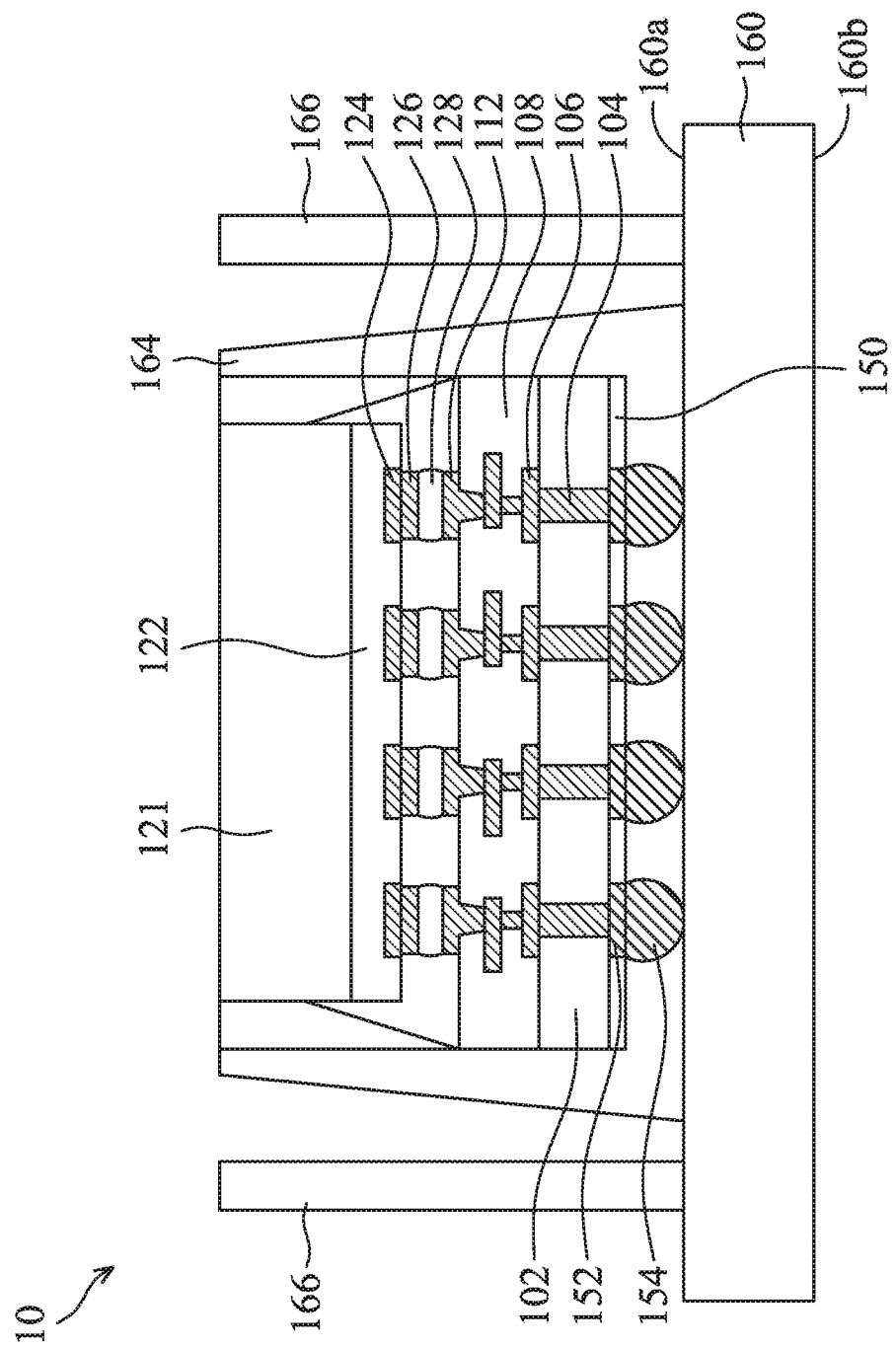

Afterwards, as shown in FIG. 1H, a package layer 164 surrounds and protects the die structure 10, and a ring structure 166 is formed over the first surface 160a of the second substrate 160, in accordance with some embodiments of the disclosure. The ring structure 166 is used to protect the die structure 10 and prevent the die structure 10 from being bent.

The ring structure 166 provides an adequate support function and warpage control. In some embodiments, the ring structure 166 includes a supportive material such as a polymer, a metal, a ceramic, or a combination thereof.

Figure 1I:
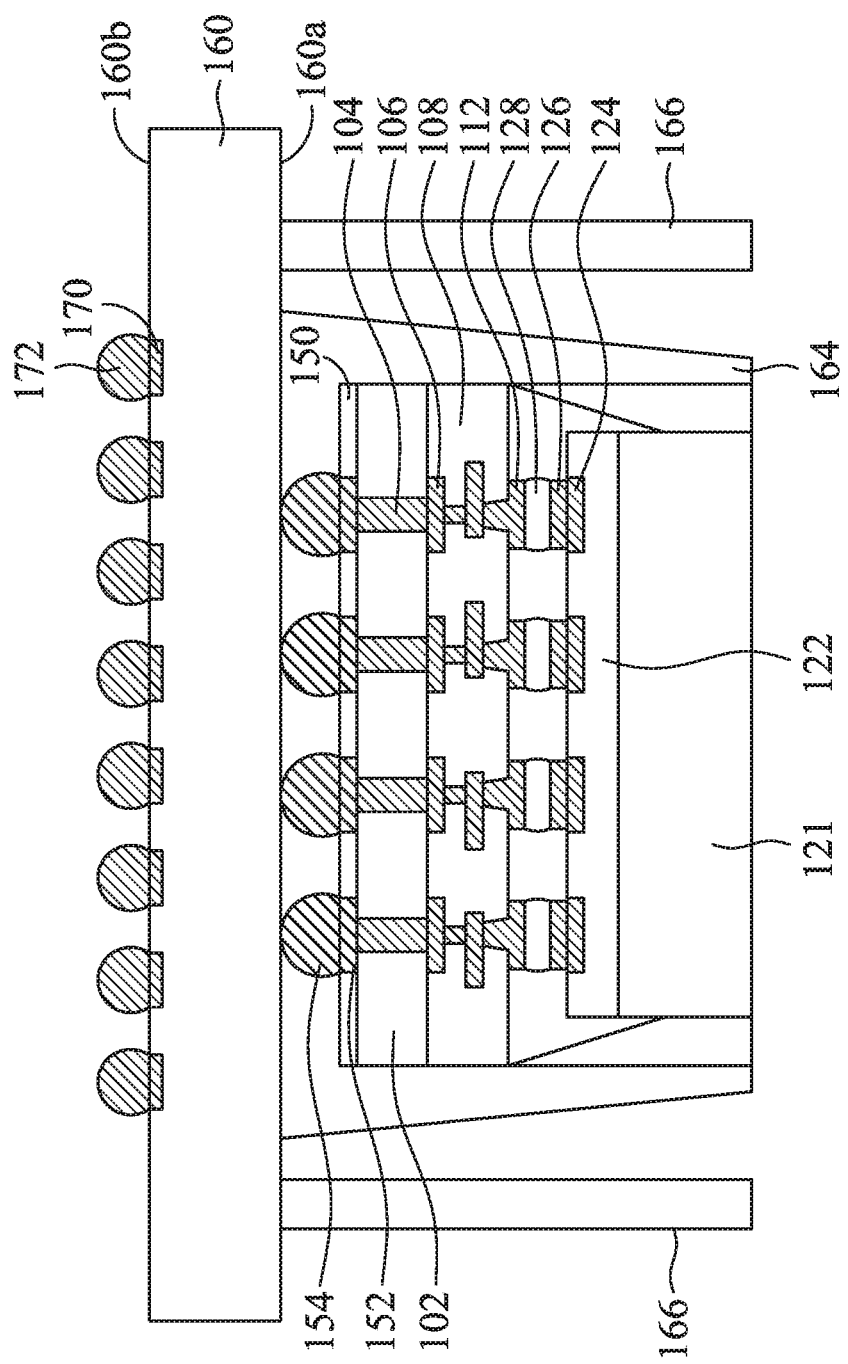

Afterwards, as shown in FIG. 1I, the die structure 10 is turned upside down, a number of conductive pads 170 is formed in the second substrate 160, and a number of electrical connectors 172 is formed over the conductive pads 170, in accordance with some embodiments of the disclosure. More specifically, the electrical connectors 172 are formed on the second surface 160b of the second substrate 160.

Figure 1J:
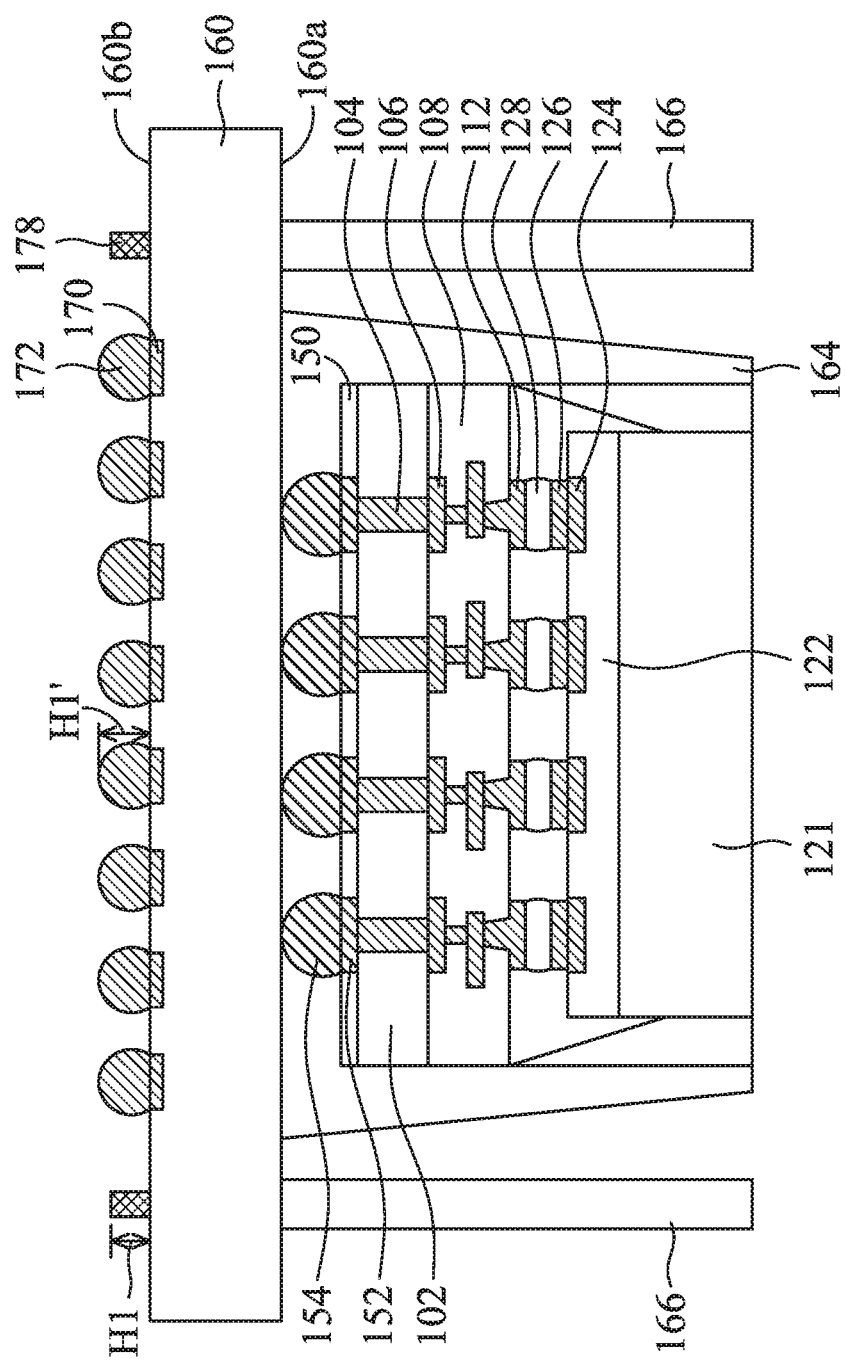

Afterwards, as shown in FIG. 1J, a first protruding structure 178 is formed in a peripheral region of the second substrate 160, in accordance with some embodiments of the disclosure. The first protruding structure 178 surrounds the electrical connectors 172.

The first protruding structure 178 is used to provide mechanical and structural support for the second substrate 160. In addition, the first protruding structure 178 is used to control the height of the electrical connectors 172.

The first protruding structure 178 is made of a polymer, a metal, a ceramic, or a combination thereof. In some embodiments, the polymer is poly(methyl methacrylate) (PMMA), an epoxy-based resin with fillers dispersed therein. The fillers may include insulating fibers, insulating particles, other suitable elements, or a combination thereof. In some embodiments, the glass transition point (Tg) of the polymer is in a range from about 200 Celsius degrees to about 250 Celsius degrees. In some embodiments, the metal is copper (Cu), copper alloy, aluminum (Al), aluminum alloy, tungsten (W), tungsten alloy, titanium (Ti), titanium alloy, tantalum (Ta) or tantalum alloy.

The first protruding structure 178 is formed by a deposition process, and a curing process. In some embodiments, the deposition process includes a printing, chemical vapor deposition (CVD) process, physical vapor deposition (PVD) process or another applicable process. In some embodiments, when the first protruding structure 178 is made of polymer, the curing process is operated at a temperature in a range from about 120 Celsius degrees to about 200 Celsius degrees. In some embodiments, the curing process is operated for a period of time in a range from about 0.5 hours to about 2 hours.

As shown in FIG. 1J, the first protruding structure 178 has a first height $H_1$. Each of the electrical connectors 172 has an original height Hr. In some embodiments, the original height $H_1'$ is higher than the first height $H_1$. Since each of the electrical connectors 172 may be different heights, and the bonding surface of the electrical connectors 172 may be at the same level. In order to reduce the degree of non-planarity of the bonding surface, the height of the electrical connectors 172 is adjusted by the pressing process 20.

Figure 1K:
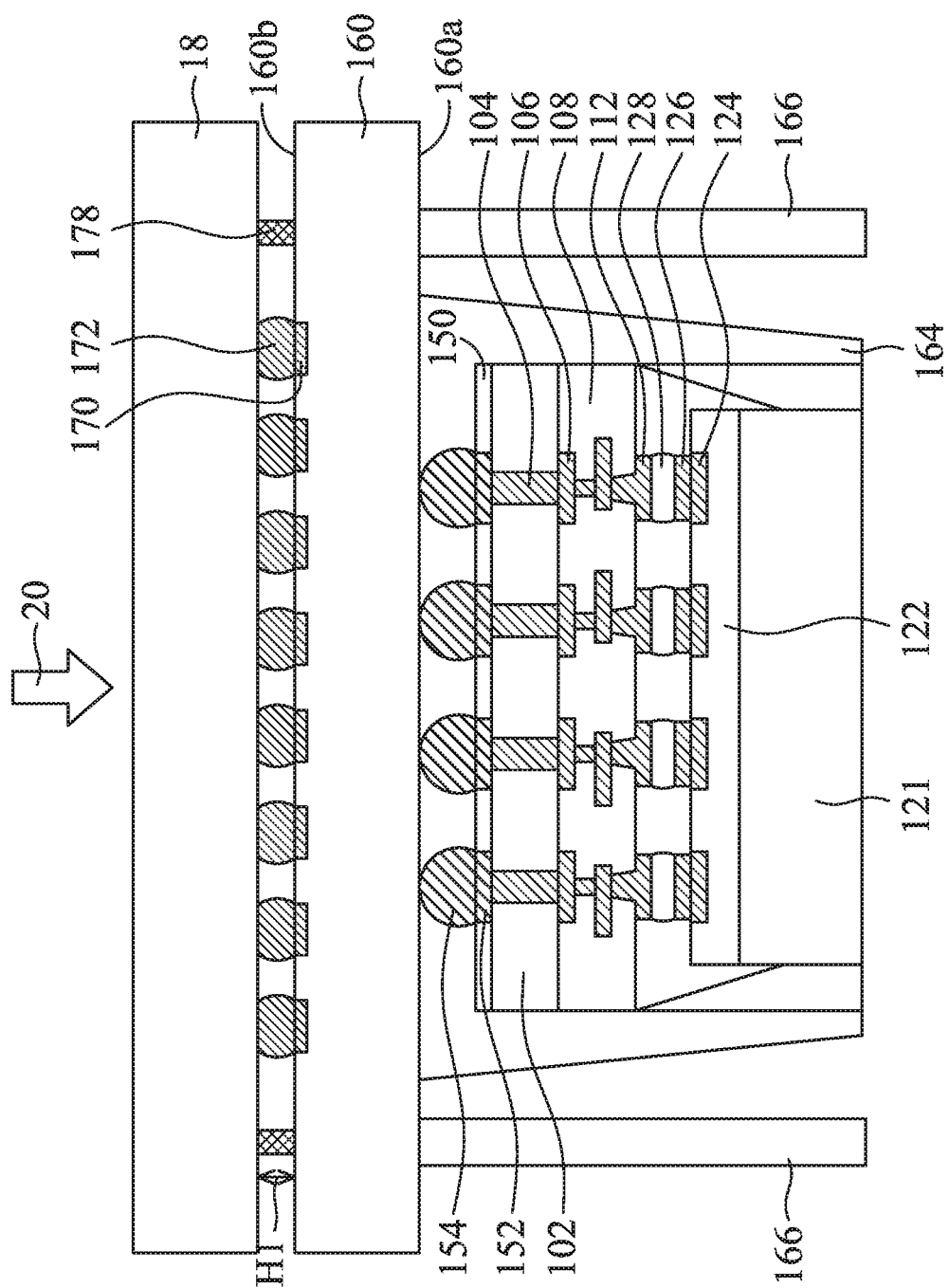

Next, as shown in FIG. 1K, a pressing process 20 is performed on the electrical connectors 172 and the first protruding structure 178 by a molding device 18, in accordance with some embodiments of the disclosure.

In some embodiments, the pressing process 20 is operated at a force in a range from about 500 Kg to about 5000 kg per die structure 10. In some embodiments, the pressing process 20 is operated at a temperature in a range from about 30 Celsius degrees to about 150 Celsius degrees.

After the pressing process 20, each of the electrical connectors 172 and the first protruding structure 178 are the same height, e.g. first height $H_1$. In some embodiments, the first height $H_1$ is in a range from about 0.2 mm to about 0.8 mm. The electrical connectors 172 have a substantially planar top surface. Where applicable, the term "substantially" may also relate to 90% or higher, such as 95% or higher, especially 99% or higher, including 100%.

Figure 1L:
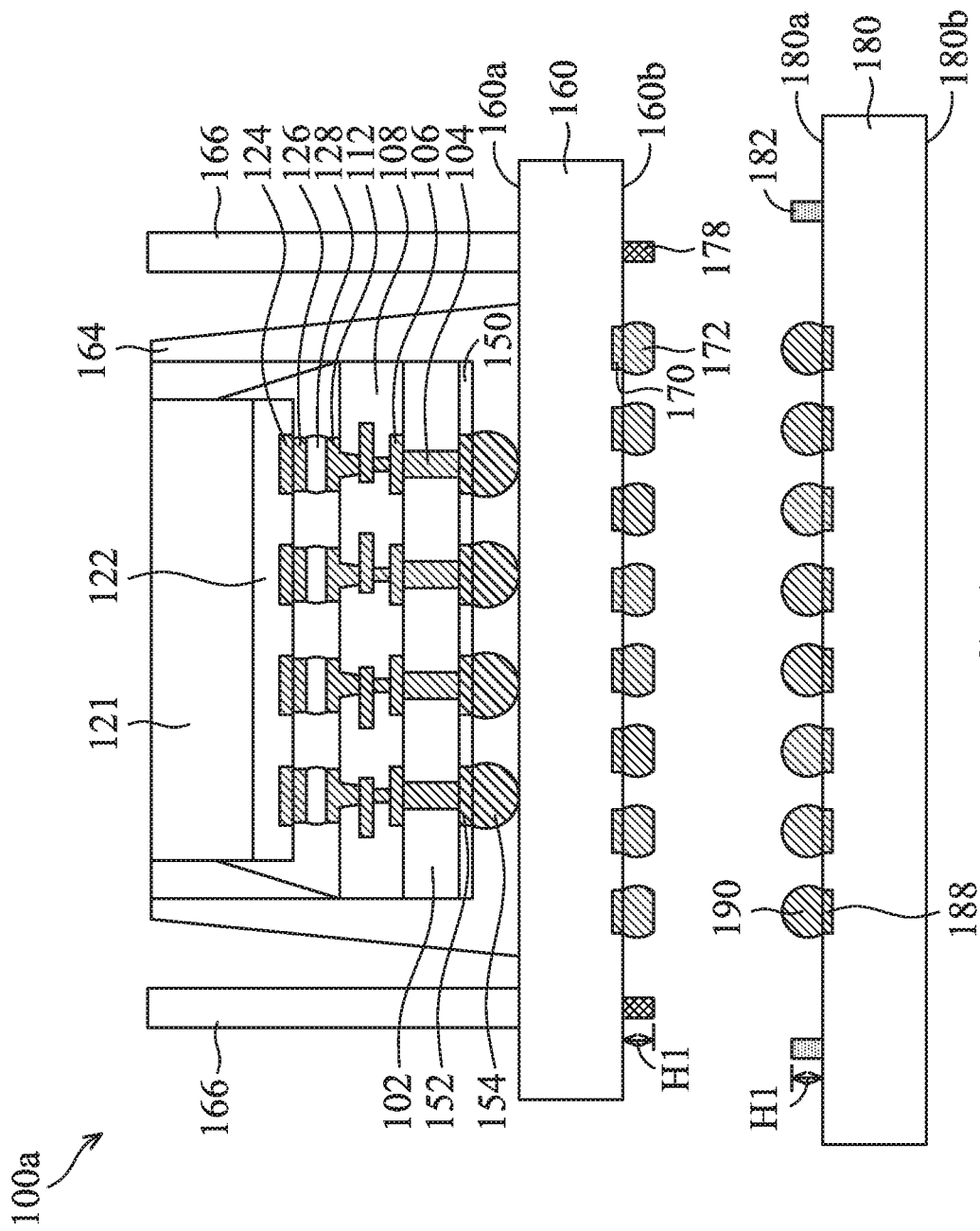

Afterwards, as shown in FIG. 1L, after the pressing process 20, a third substrate 180 is provided with a second protruding structure 182, and the second protruding structure 182 faces to the first protruding structure 178, in accordance with some embodiments of the disclosure. Similar to the first protruding structure 178, the second protruding structure 182 is also used as a mechanical and structural support.

The first protruding structure 178 and the second protruding structure 182 are configured to use as alignment marks. The first protruding structure 178 does not overlap the second protruding structure 182 after the second substrate 160 is bonded to the third substrate 180. Before the second substrate 160 is bonded to the third substrate 180, the electrical connectors 178 below the second surface 160b of the second substrate 160 should align with corresponding electrical connector 190 formed on the first surface 180a of the third substrate 180. The electrical connector 190 is formed on the conductive pad 188. However, in some embodiments, the electrical connectors 178 may not align with the corresponding electrical connector 190, and therefore the bonding reliability of the second substrate 160 to the third substrate 180 is reduced.

In order to prevent the misalignment issue, the first protruding structure 178 and the second protruding structure 182 are respectively formed on second substrate 160 and the third substrate 180. During the second substrate 160 is bonded to the third substrate 180, the alignment between the electrical connectors 178 and the electrical connector 190 is controlled by detecting the locations of alignment mark (such as, the first protruding structure 178 and the second protruding structure 182). Therefore, the accuracy of alignment is improved by forming the first protruding structure 178 and the second protruding structure 182.

The second protruding structure 182 is made of a polymer, a metal, a ceramic, or a combination thereof. In some embodiments, the first protruding structure 178 and the second protruding structure 182 are made of different materials. The third substrate 180 is a printed circuit board (PCB), a ceramic substrate or another suitable package substrate. In some embodiments, the first protruding structure 178 and the second protruding structure 182 are both the same height $H_1$.

Figure 1M:
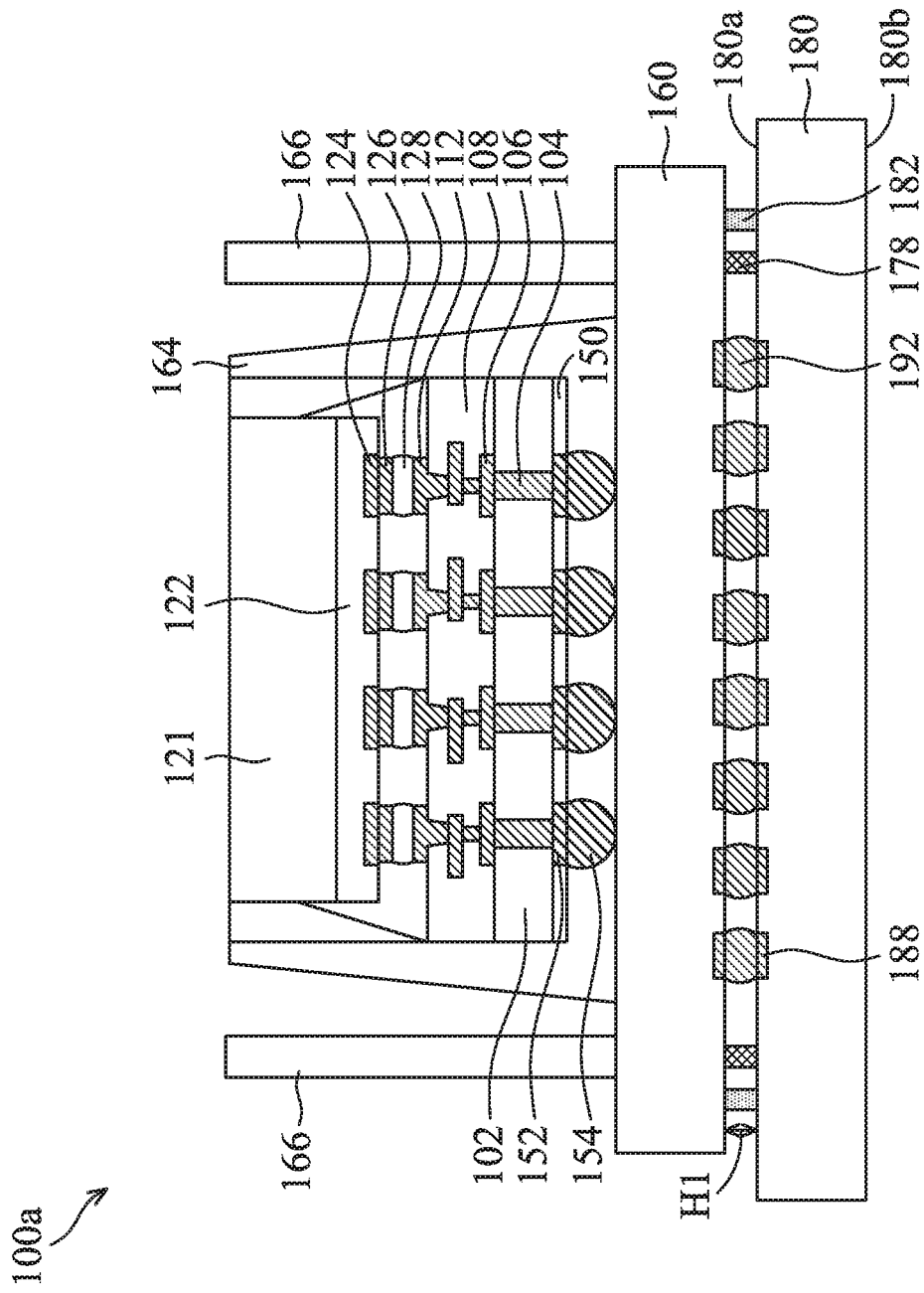
Figure 1M:
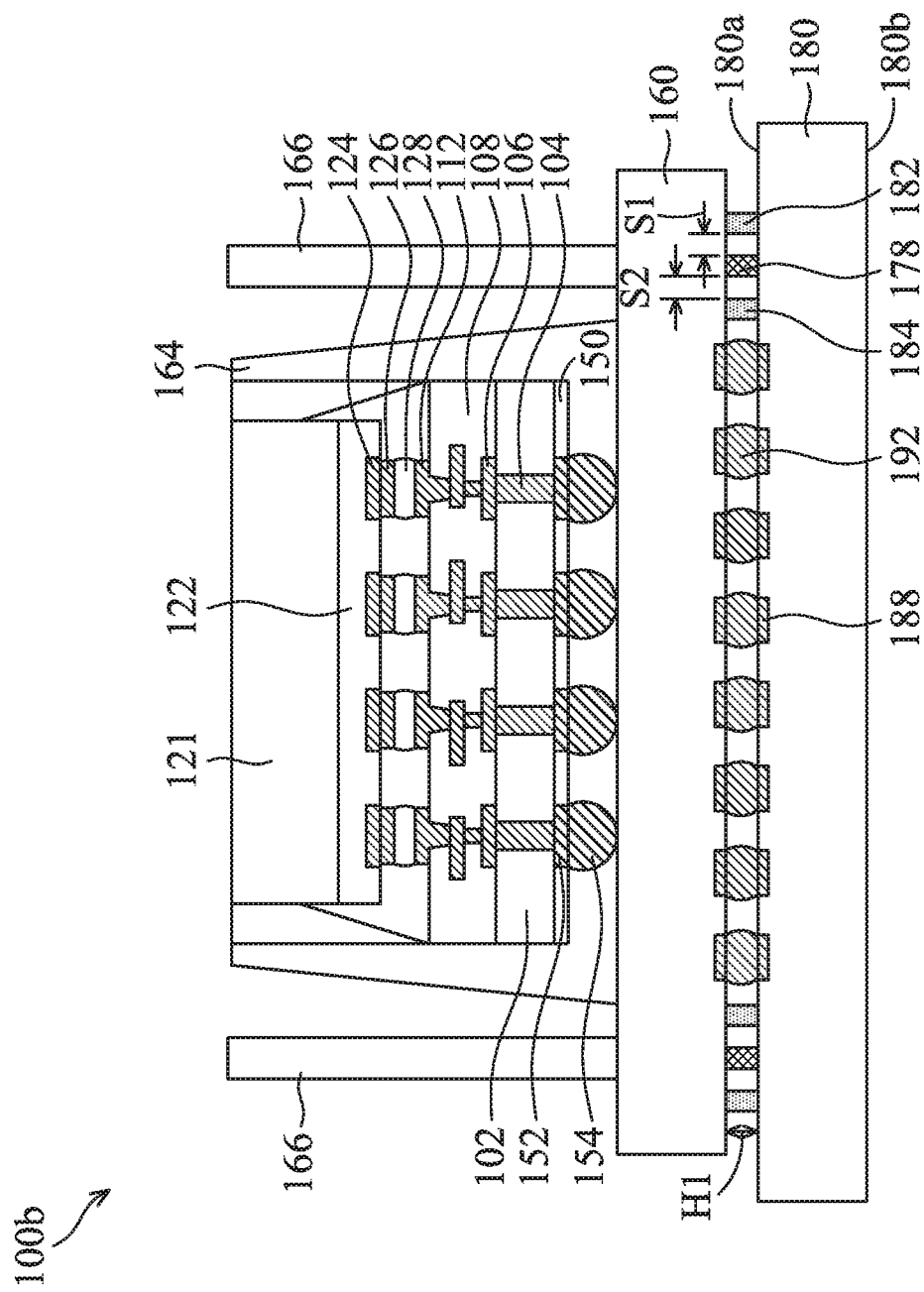

Subsequently, as shown in FIG. 1M, the second substrate 160 is bonded to the third substrate 180, in accordance with some embodiments of the disclosure. More specifically, each of the electrical connectors 178 is connected to corresponding each of the electrical connectors 190 by a reflow process to form the electrical connectors 192.

After the second substrate 160 is bonded to the third substrate 180, the first protruding structure 178 does not overlap with the second protruding structure 182. The first protruding structure 178 is closer than one of the electrical connectors 172 than the second protruding structure 182. In some embodiments, the outer sidewall of the first protruding structure 178 is substantially aligned with the outer sidewall of the ring structure 166.

Since the first protruding structure 178 is configured to provide mechanical and structural support for the second substrate 160, the warpage of the second substrate 160 can be reduced. In addition, the first protruding structure 178 is configured to control the height of the electrical connectors 172 when the pressing process 20 is performed on the electrical connectors 172. By forming the first protruding structure 178 and the second protruding structure 182, the misalignment issue is reduced when the second substrate 160 is bonded to the third substrate 180. Therefore, the bonding reliability of the package structure 100a is improved.

FIG. 1M' shows a cross-sectional representation of a package structure 100b, in accordance with some embodiments of the disclosure. The package structure 100b is similar to, or the same as, the package structure 100a shown in FIG. 1M, except that a third protruding structure 184 is initially formed over the third structure 180 and next to the second protruding structure 182. Processes and materials used to form the package structure 100c may be similar to, or the same as, those used to form the package structure 100a and are not repeated herein.

After the second substrate 160 is bonded to the third substrate 180, the first protruding structure 178 is between the second protruding structure 182 and the third protruding structure 184.

The space between the second protruding structure 182 and the third protruding structure 184 is used to dispose the first protruding structure 178. The first protruding structure 178, the second protruding structure 182 and the third protruding structure 184 are used as alignment marks. There is a first space $S_1$ between the first protruding structure 178 and the second protruding structure 182, and there is a second space S2 between the first protruding structure 178 and the third protruding structure 184. In some embodiments, the first space $S_1$ is substantially equal to the second space $S_2$. If the first space $S_1$ or the second space $S_2$ is not within a certain range, the electrical connector 172 may not be aligned with the corresponding electrical connector 190. Therefore, the bonding strength between the second substrate 160 and the third substrate 180 is reduced due to the misalignment.

In some embodiments, the first space $S_1$ is in a range from about 0.05 mm to about 0.5 mm. In some embodiments, the second space $S_2$ is in a range from about 0.05 mm to about 0.5 mm. When the first space $S_1$ and the second space $S_2$ are within above-mentioned range, the accuracy of the alignment between the second substrate 160 and the third substrate 180 is improved.

Figure 2A:
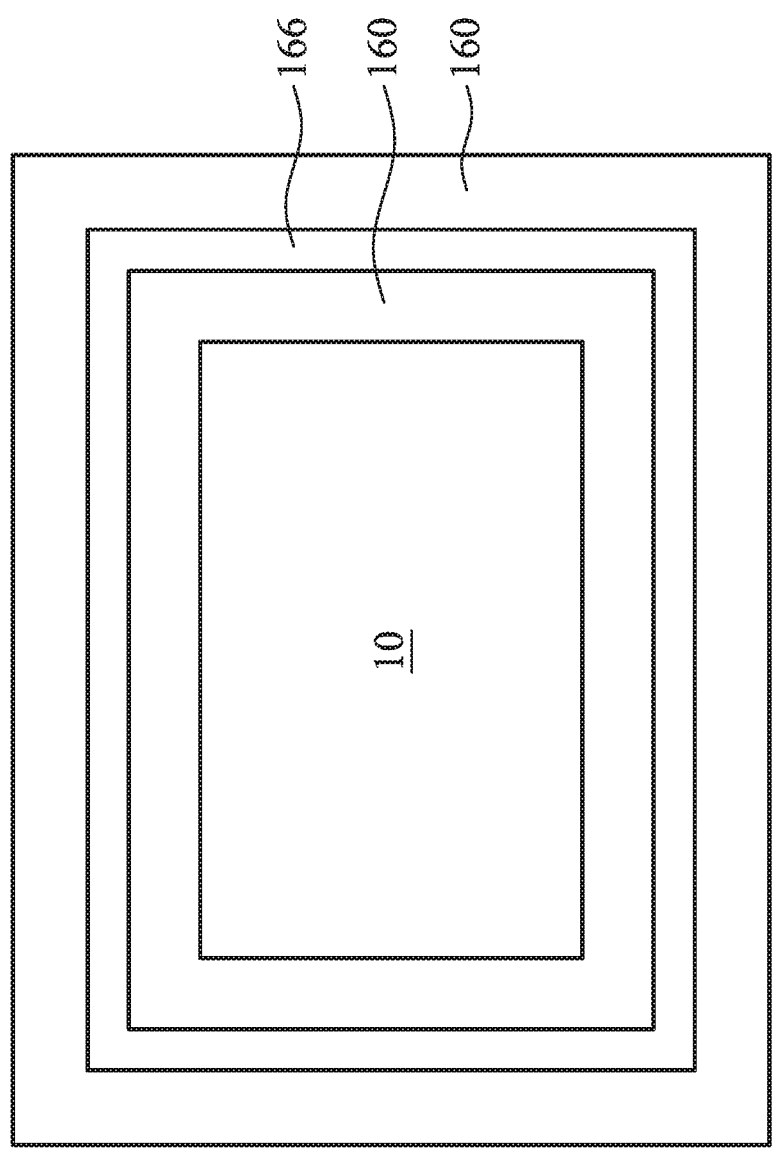
FIG. 2A shows a top-view representation of the ring structure, in accordance with some embodiments of the disclosure.

FIG. 2A shows a top-view representation of the ring structure 166 in FIG. 1H, in accordance with some embodiments of the disclosure. The ring structure 166 has a rectangular shape when seen from a top-view and surrounds the die structure 10.

Figure 2B:
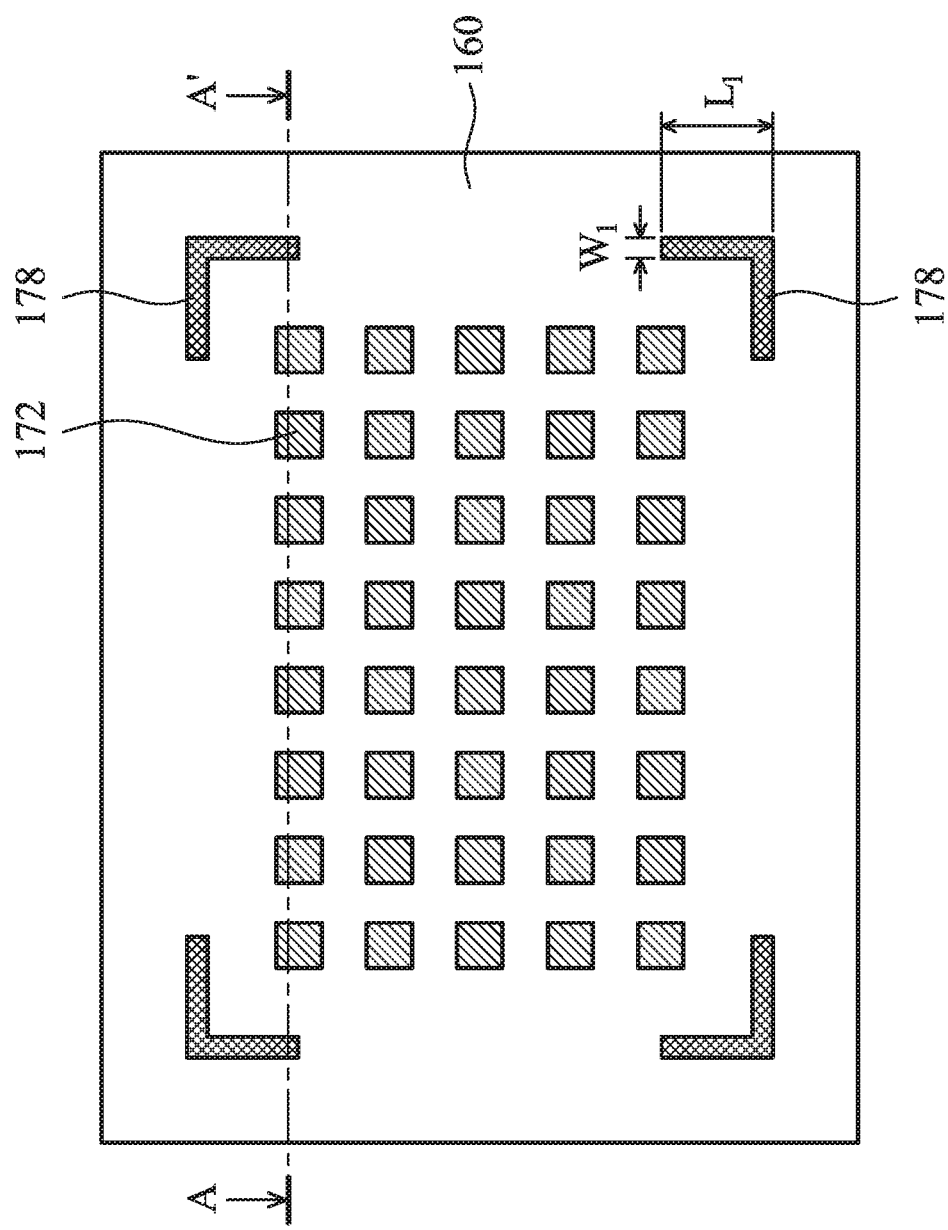
FIG. 2B shows a top-view representation of the first protruding structure in FIG. 1K, in accordance with some embodiments of the disclosure.

FIG. 2B shows a top-view representation of the first protruding structure 178 in FIG. 1K, in accordance with some embodiments of the disclosure. FIG. 1L shows a cross-sectional representation of the second substrate 160 taken along line A-A' of FIG. 2B.

The first protruding structure 178 has four sub-portions when seen from a top-view. Each of the four sub-portions has an L-shape when seen from a top-view. Each of the sub-portions of the first protruding structure 178 is located in a corner of the first substrate 160. In some embodiments, each of the sub-portions of the first protruding structure 178 has a first width $W_1$ in a range from about 0.1 mm to about 1 mm. In some embodiments, each of the sub-portions of the first protruding structure 178 has a first length $L_1$ in a range from about 1 mm to about 5 mm.

The electrical connectors 172 have rectangular shape since the electrical connectors 172 are pressed in the pressing process 20.

Figure 2C:
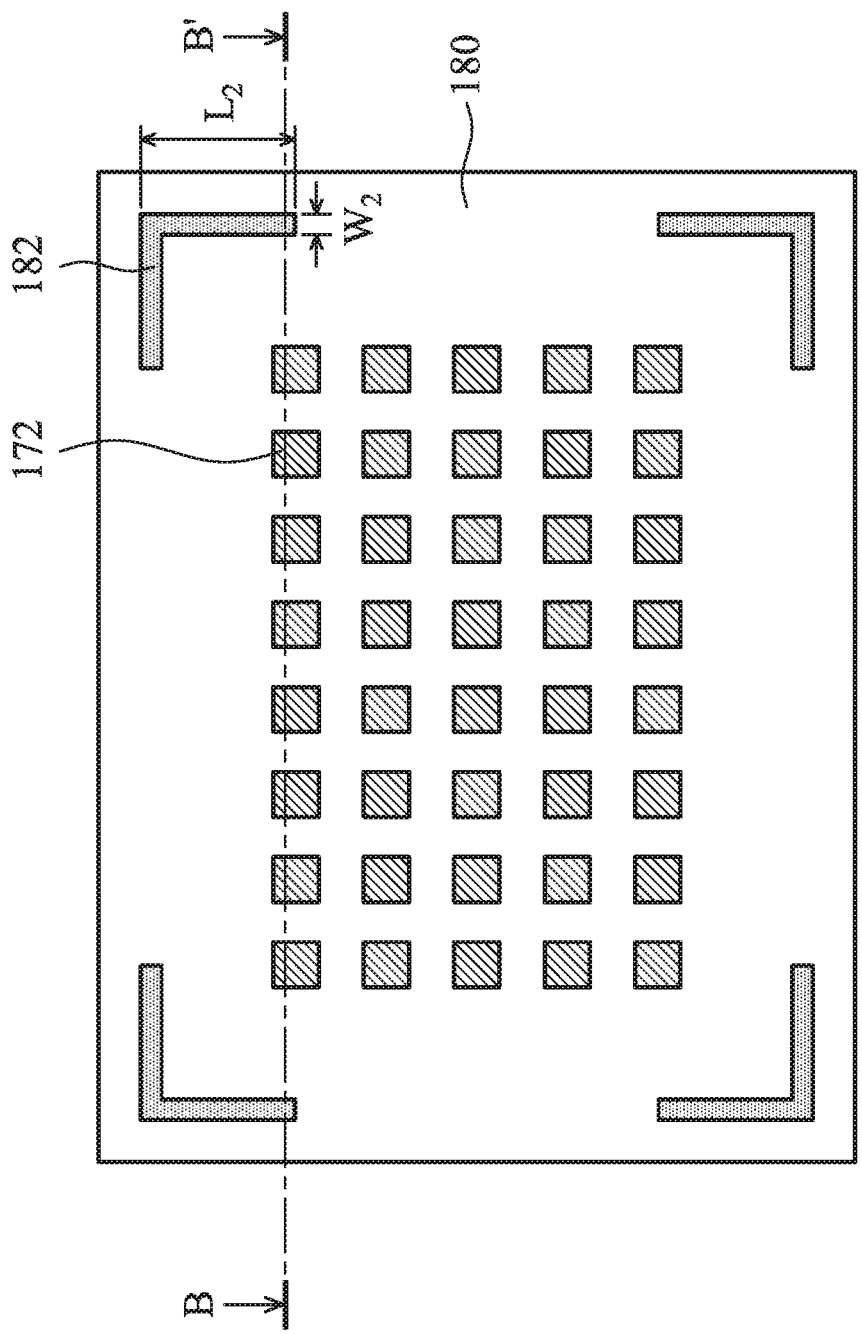
FIG. 2C shows a top-view representation of the second protruding structure in FIG. 1L, in accordance with some embodiments of the disclosure.
Figure 2C:
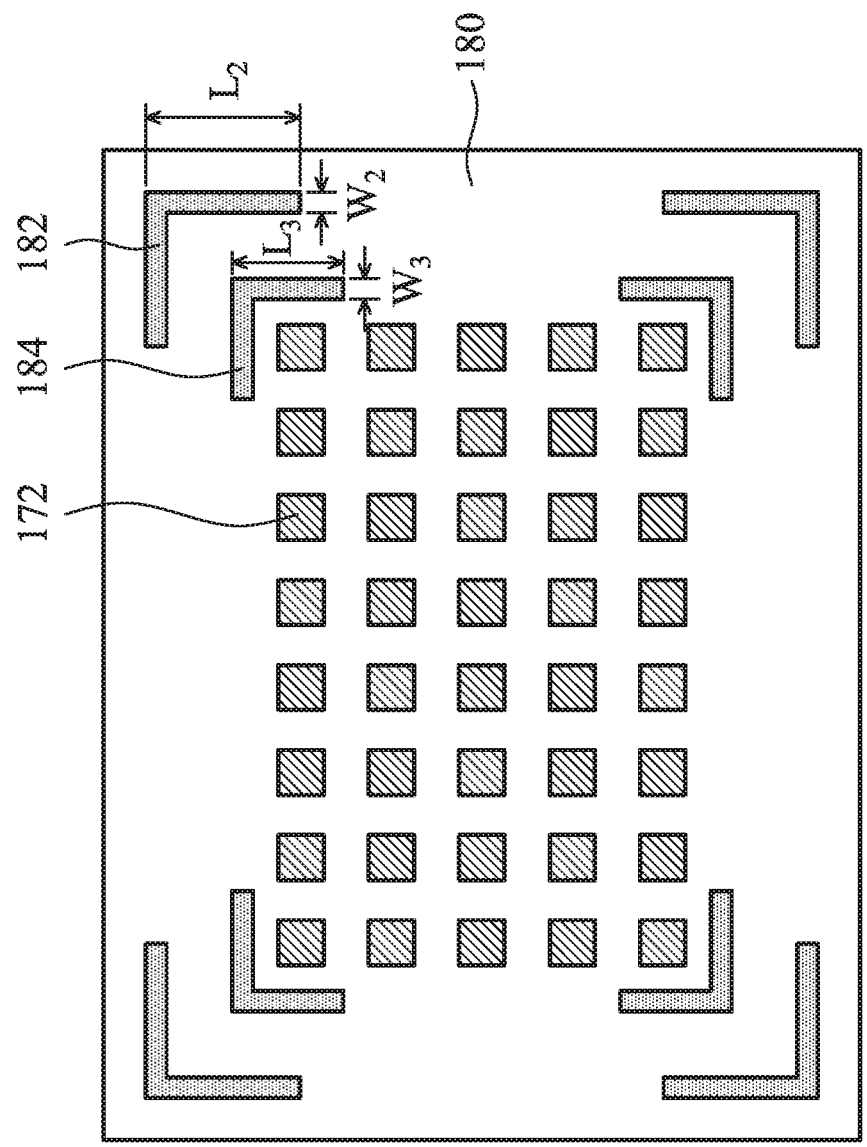

FIG. 2C shows a top-view representation of the second protruding structure 182 in FIG. 1L, in accordance with some embodiments of the disclosure. FIG. 1L shows a cross-sectional representation of the third substrate 180 taken along line B-B' of FIG. 2C.

The second protruding structure 182 has four sub-portions when seen from a top-view. Each of the sub-portions of the second protruding structure 182 is located in a corner of the third substrate 180. In some embodiments, each of the sub-portions of the second protruding structure 182 has a second width $W_2$ in a range from about 0.1 mm to about 1 mm. In some embodiments, each of the sub-portions of the second protruding structure 182 has a second length $L_2$ in a range from about 1 mm to about 5 mm.

FIG. 2C' shows a top-view representation of the second protruding structure 182 and the third protruding structure 184, in accordance with some embodiments of the disclosure.

Similar to the second protruding structure 182, the third protruding structure 184 also has four sub-portions when seen from a top-view. Each of the sub-portions of the third protruding structure 184 is located in a corner of the third substrate 180. In some embodiments, each of the sub-portions of the third protruding structure 184 has a third width $W_3$ in a range from about 0.1 mm to about 1 mm. In some embodiments, each of the sub-portions of the third protruding structure 184 has a third length $L_3$ in a range from about 1 mm to about 5 mm.

FIGS. 3A-3E show cross-sectional representations of various stages of forming a package structure 100c, in accordance with some embodiments of the disclosure. The package structure 100c is similar to, or the same as, the package structure 100a shown in FIG. 1M, except that the second substrate 160 warps or bends upwardly. Processes and materials used to form the package structure 100c may be similar to, or the same as, those used to form the package structure 100a and are not repeated herein.

Figure 3A:
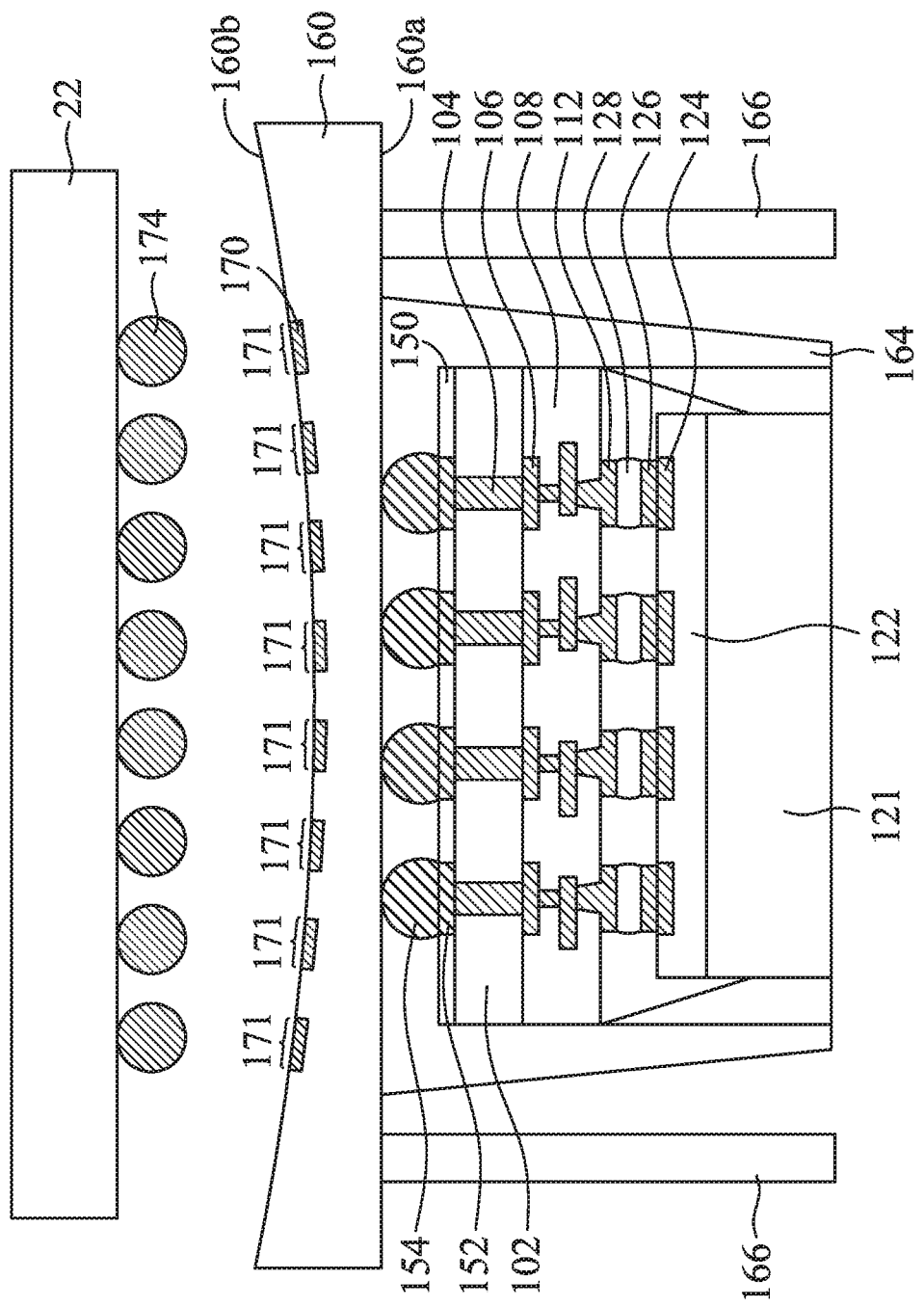
FIGS. 3A-3E show cross-sectional representations of various stages of forming a package structure, in accordance with some embodiments of the disclosure.

As shown in FIG. 3A, the second substrate 160 exhibit warpage after the thermal processes. Afterwards, a flux 171 is formed over the conductive pads 170. The conductive material 174 is below the device 22 and faces the flux 171. Since the second substrate 160 exhibits warpage, the flux 171 is formed on non-planar top surface of the second substrate 160.

The flux 171 is used to inhibit or prevent an oxide form being generated on the surfaces of the electrical connectors 172 during the reflow process. The bonding defects which may be caused by an oxide during the following reflow process may be prevented. In some embodiments, the flux 171 includes a chloride, a fluoride, a resin or another applicable material.

In some embodiments, the warpage of the second substrate 160 is caused by a coefficient of thermal expansion (CTE) mismatch between two different package materials, such as the die structure 10 and the second substrate 160, during the packaging process. The packaging process may be mounting the die structure 10 (FIG. 1G) or forming the package layer 164 over the second substrate 160 (FIG. 1H).

Figure 3B:
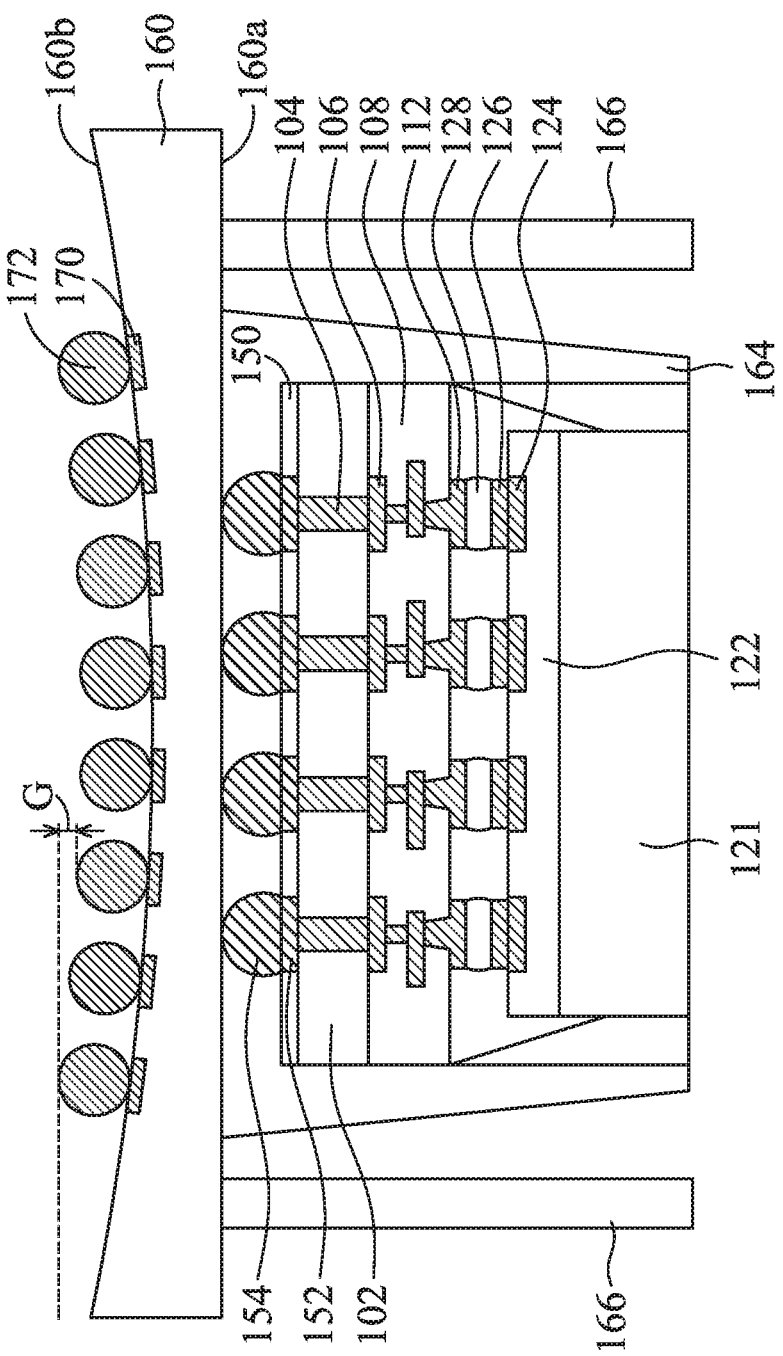

Next, as shown in FIG. 3B, the conductive material 174 is disposed on corresponding flux 171 to form the number of electrical connectors 172 by a reflow process, in accordance with some embodiments of the disclosure. As a result, the electrical connectors 172 are formed on the non-planar second surface 160b of the second substrate 160. In some embodiments, the electrical connectors 172 provide a concave bonding surface for bonding to the third substrate 180. In some other embodiments, the electrical connectors 172 provide a convex bonding surface for bonding to the third substrate 180.

It should be noted that since each of the electrical connectors 172 has the same size and formed on the non-planar second surface 160b of the second substrate 160, each of the electrical connectors 172 has different heights (levels). In some embodiments, the electrical connectors 172 located in a central region of the second substrate 160 are lower than the electrical connectors 172 located in the peripheral region of the second substrate 160.

In some embodiments, there is a distance G between the highest point and the lowest point of the electrical connectors 172. If the distance G is too large, the non-planar of the electrical connectors 172 produces a failure in the following assembly process.

Figure 3C:
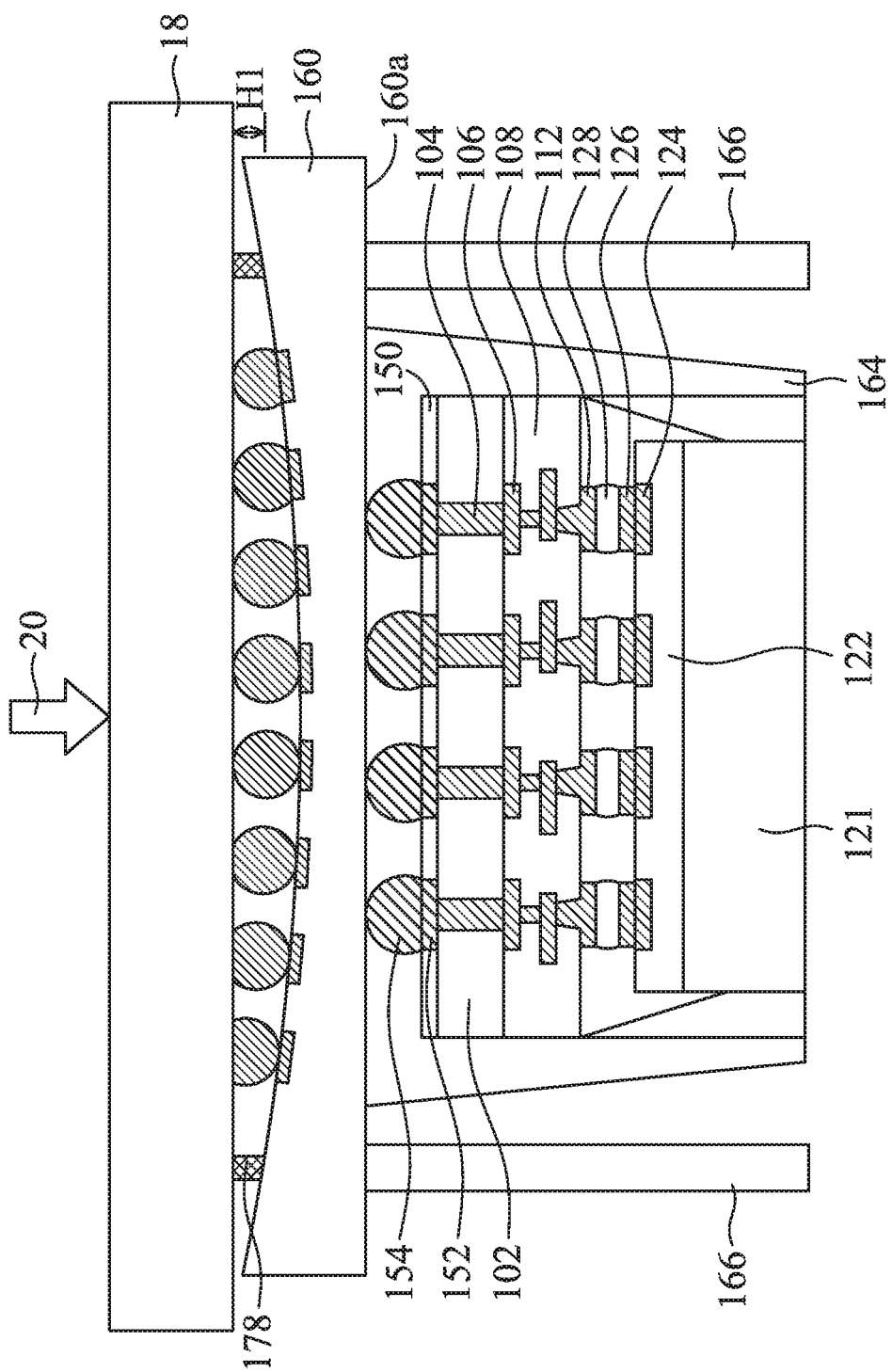

Afterwards, in order to provide a planar bonding surface, as shown in FIG. 3C, the pressing process 20 is performed on the electrical connectors 172 and the first protruding structure 178 by a molding device 18, in accordance with some embodiments of the disclosure.

It should be noted that, as shown in FIG. 3C, the first protruding structure 178 is formed on a sloped surface of the second substrate 160. The first protruding structure 178 has a planar top surface and a sloped bottom surface.

Figure 3D:
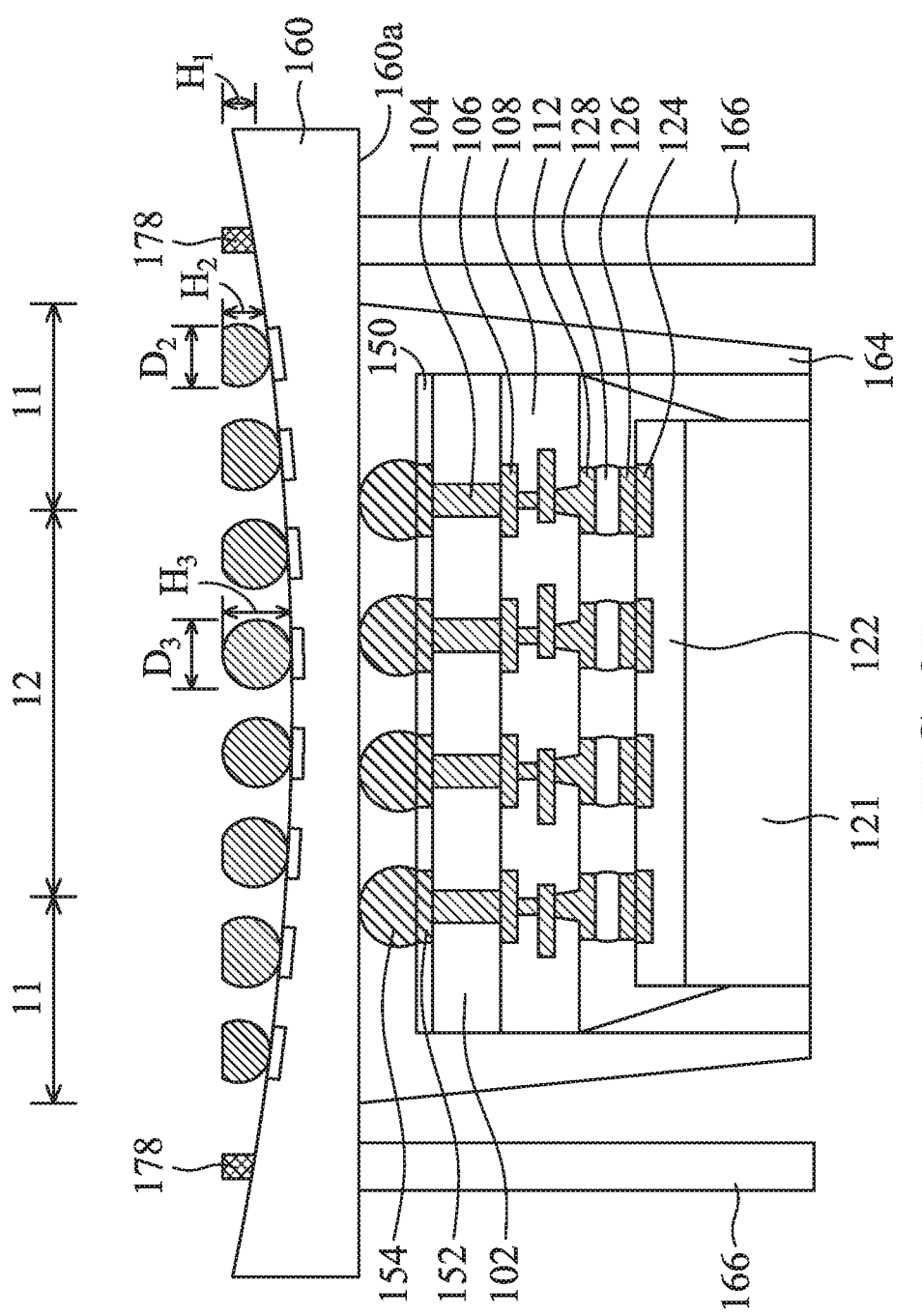

Next, as shown in FIG. 3D, the molding device 18 is removed, and the electrical connectors 172 provides a planar bonding surface, in accordance with some embodiments of the disclosure. The degree of non-planarity of the electrical connectors 172 is reduced by the pressing process 20. A portion of the electrical connectors 172 is pressed in the first region 11, e.g. the peripheral region, and the pressed electrical connectors 172 have a substantially planar top surface. Another portion of the electrical connectors 172 is not pressed in the second region 12, e.g. the central region, and the un-pressed electrical connectors 172 have a curved top surface.

The first protruding structure 178 has a first height $H_1$. The pressed electrical connectors 172 in the first region 11, e.g. the peripheral region, have a second height $H_2$ and a second width $D_2$, and the un-pressed electrical connectors 172 in the second region, e.g. the central region, have a third height $H_3$ and a third width $D_3$. In some embodiments, the first height $H_1$ is smaller than the second height $H_2$, and the second height $H_2$ is smaller than the third height $H_3$. In some embodiments, the second width $D_2$ is greater than the third width $D_3$.

Figure 3E:
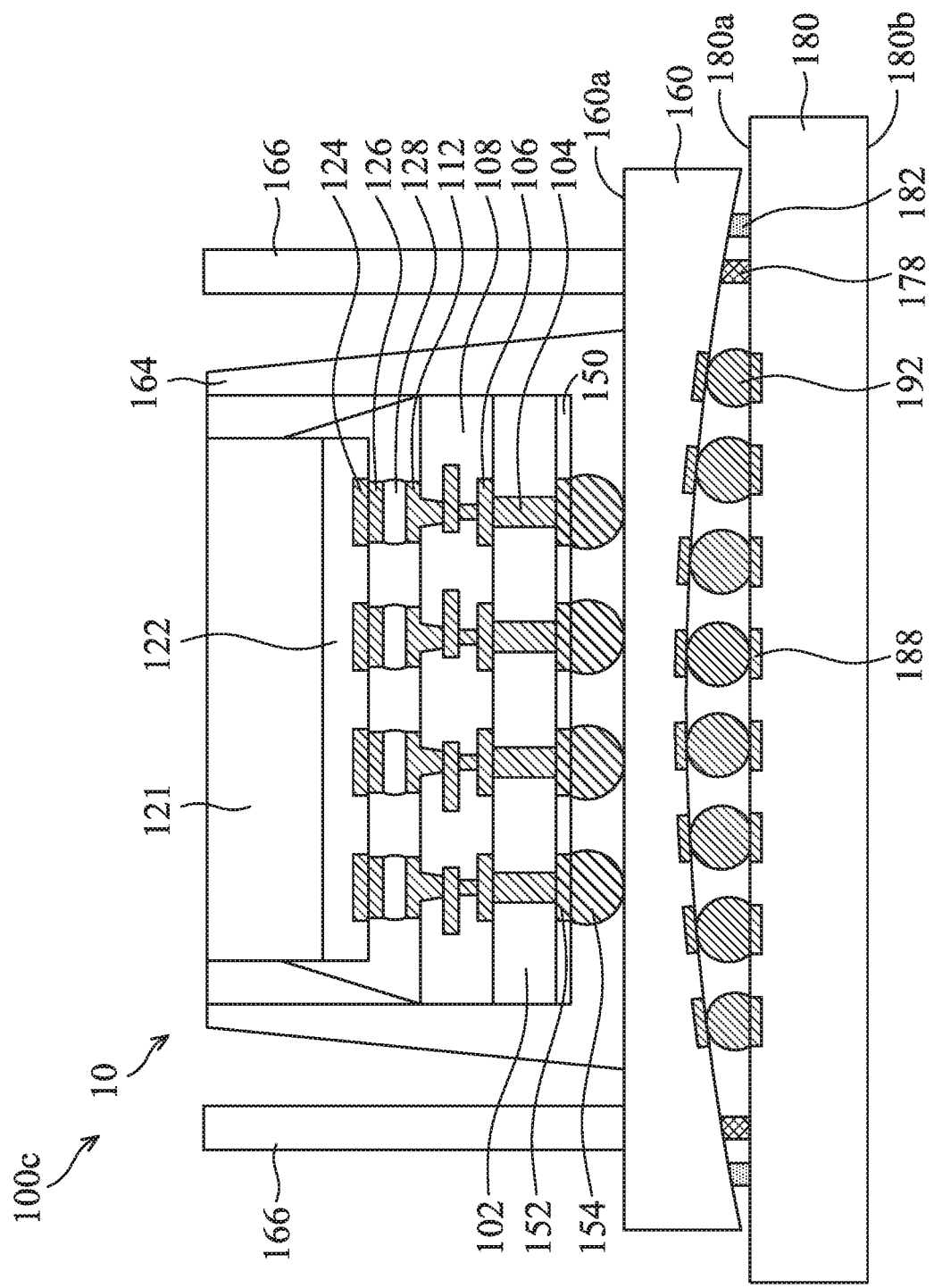
Figure 3E:
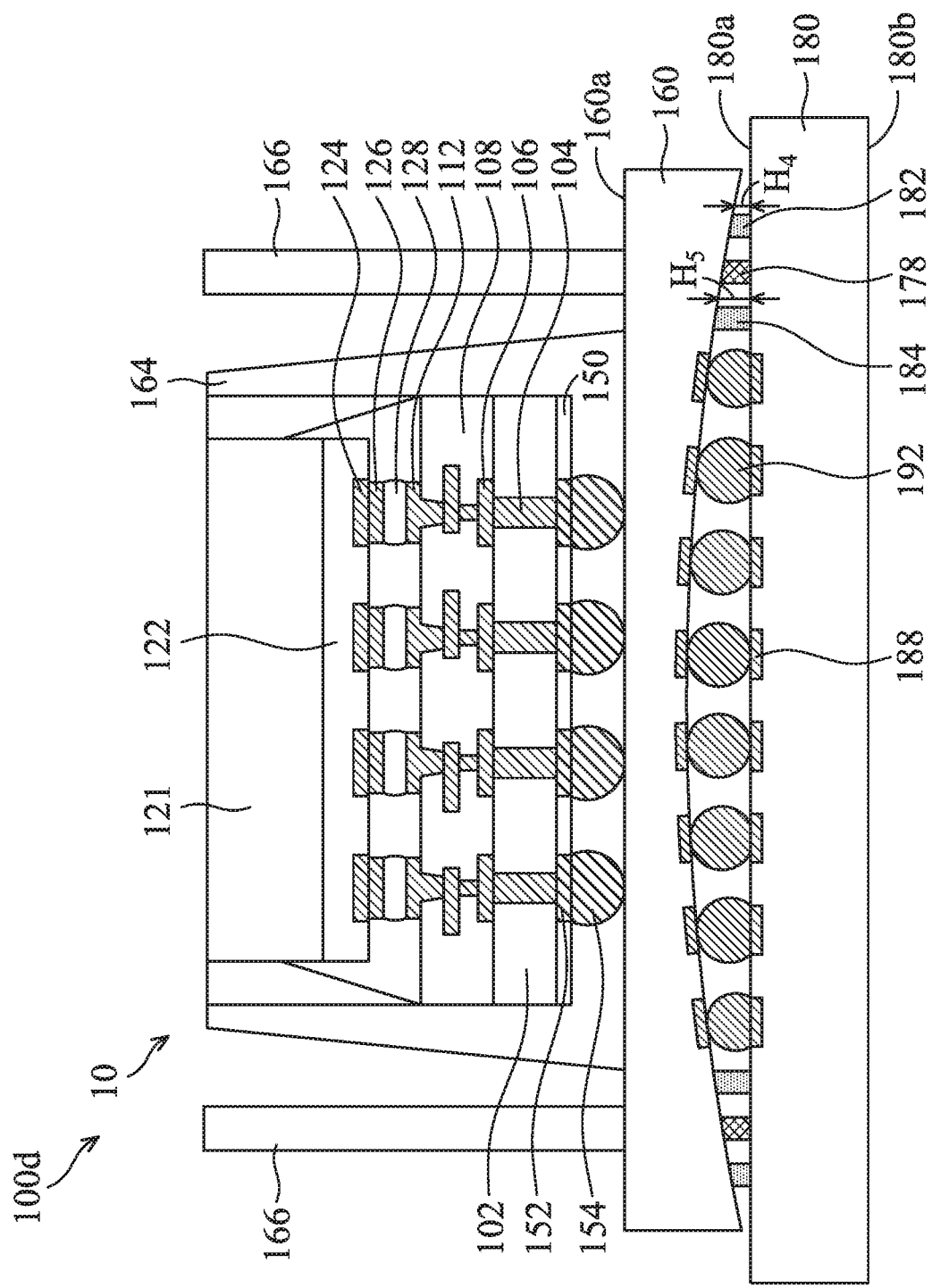

Afterwards, as shown in FIG. 3E, a third substrate 180 is provided with a second protruding structure 182, and the second substrate 160 is bonded to the third substrate 180, in accordance with some embodiments of the disclosure.

Since the second substrate 160 may exhibit warpage, if the electrical connectors 172 are not pressed in the pressing process 20, the non-planarity of bonding surface of the electrical connectors 172 is produced. As a result, a portion of the electrical connectors 172 may not be in contact with the third substrate 180, and the bonding reliability between the second substrate 160 and the third substrate 180 is reduced. In order to compensate the warpage, the electrical connectors 172 are pressed before the second substrate 160 is bonded to the third substrate 180. Therefore, the co-planarity of the bonding surface of the electrical connectors 172 is improved, and the bonding reliability of the package structure 100c is improved.

FIG. 3E' shows a cross-sectional representation of a package structure 100d, in accordance with some embodiments of the disclosure. The package structure 100d is similar to, or the same as, the package structure 100c shown in FIG. 3E, except that a third protruding substrate 180 is initially formed over the third structure 184 and next to the second protruding structure 182. Processes and materials used to form the package structure 100d may be similar to, or the same as, those used to form the package structure 100c and are not repeated herein.

As shown in FIG. 3E', the first protruding structure 178 is between the second protruding structure 182 and the third protruding structure 184. The second protruding structure 182 has a fourth height $H_4$, and the third protruding structure 184 has a fifth height $H_5$. In some embodiments, the fifth height $H_5$ is greater than the first height $H_1$, and the first height $H_1$ is greater than the fourth height $H_4$.

Figure 4A:
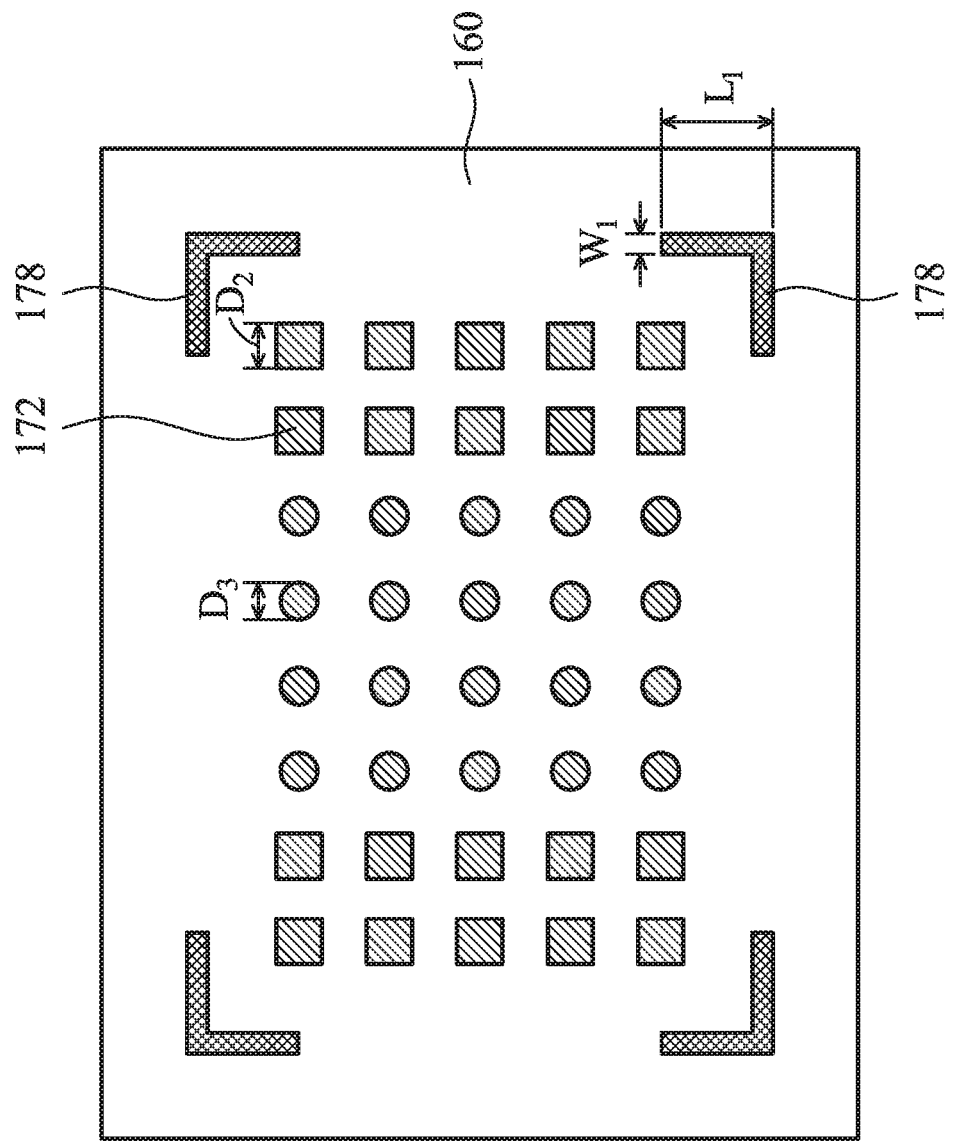
FIG. 4A shows a top-view representation of the first protruding structure in FIG. 3D, in accordance with some embodiments of the disclosure.

FIG. 4A shows a top-view representation of the first protruding structure 178 in FIG. 3D, in accordance with some embodiments of the disclosure.

The first protruding structure 178 has four sub-portions when seen from a top-view. Each of the four sub-portions has an L-shape when seen from a top-view. Each of the sub-portions of the first protruding structure 178 is located in a corner of the first substrate 160. In some embodiments, each of the sub-portions of the first protruding structure 178 has a first width $W_1$ in a range from about 0.1 mm to about 1 mm. In some embodiments, each of the sub-portions of the first protruding structure 178 has a first length $L_1$ in a range from about 1 mm to about 5 mm.

The electrical connectors 172 in the first region have a rectangular shape since the electrical connectors 172 are pressed in the pressing process 20. The electrical connectors 172 in the second region have a circular shape since these electrical connectors 172 are not pressed.

Figure 4B:
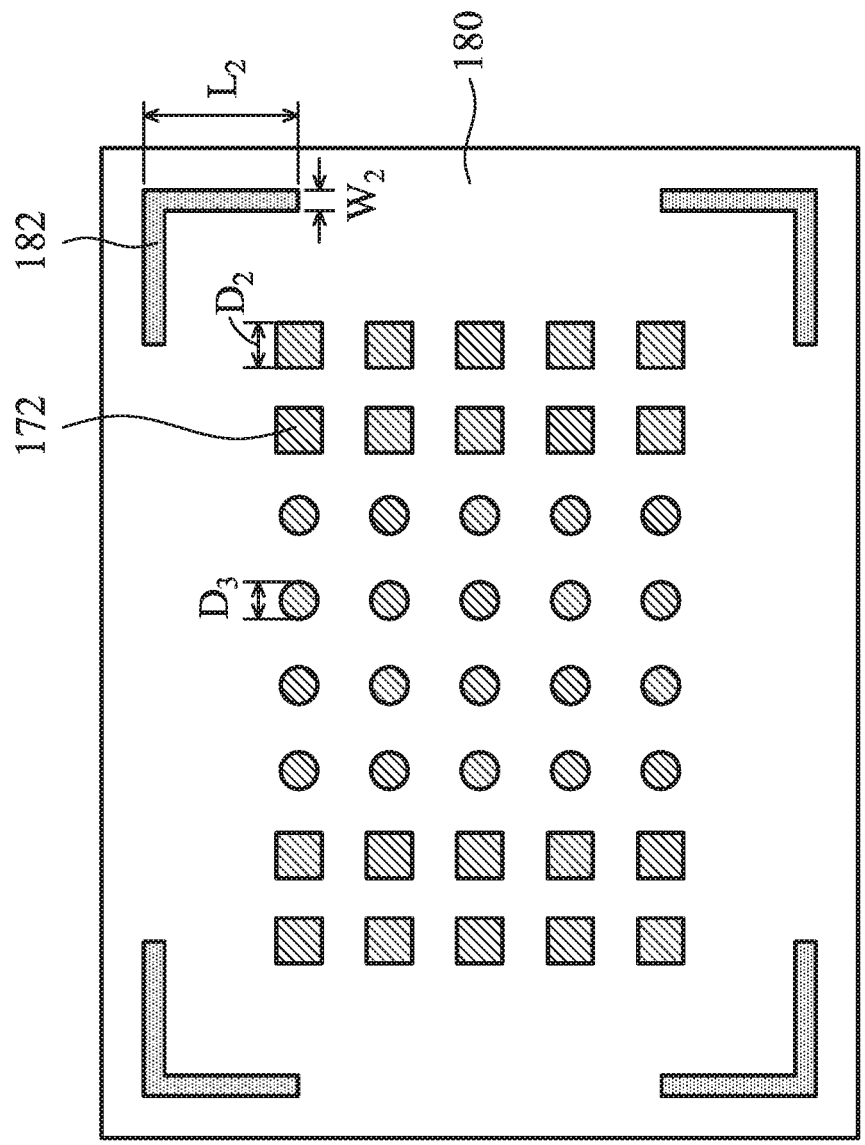
FIG. 4B shows a top-view representation of the second protruding structure in FIG. 3E, in accordance with some embodiments of the disclosure.
Figure 4B:
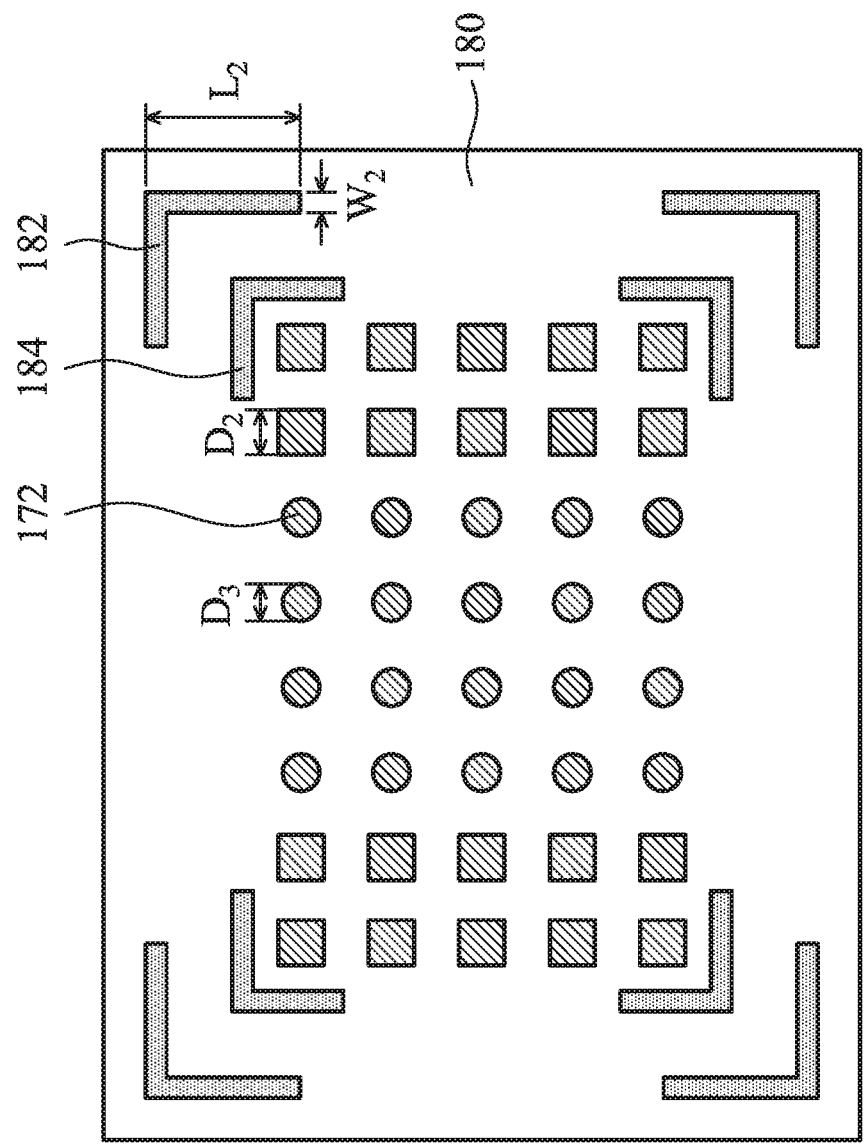

FIG. 4B shows a top-view representation of the second protruding structure 182 in FIG. 3E, in accordance with some embodiments of the disclosure.

The second protruding structure 182 has four sub-portions when seen from a top-view. Each of the four sub-portions has an L-shape when seen from a top-view. Each of the sub-portions of the second protruding structure 182 is located in a corner of the third substrate 180. In some embodiments, each of the sub-portions of the second protruding structure 182 has a second width $W_2$ in a range from about 0.1 mm to about 1 mm. In some embodiments, each of the sub-portions of the second protruding structure 182 has a second length $L_2$ in a range from about 1 mm to about 5 mm.

FIG. 4B' shows a top-view representation of the second protruding structure 182 and the third protruding structure 184, in accordance with some embodiments of the disclosure.

Similar to the second protruding structure 182, the third protruding structure 184 also has four sub-portions when seen from a top-view. Each of the sub-portions of the third protruding structure 184 is located in a corner of the third substrate 180.

Figure 5:
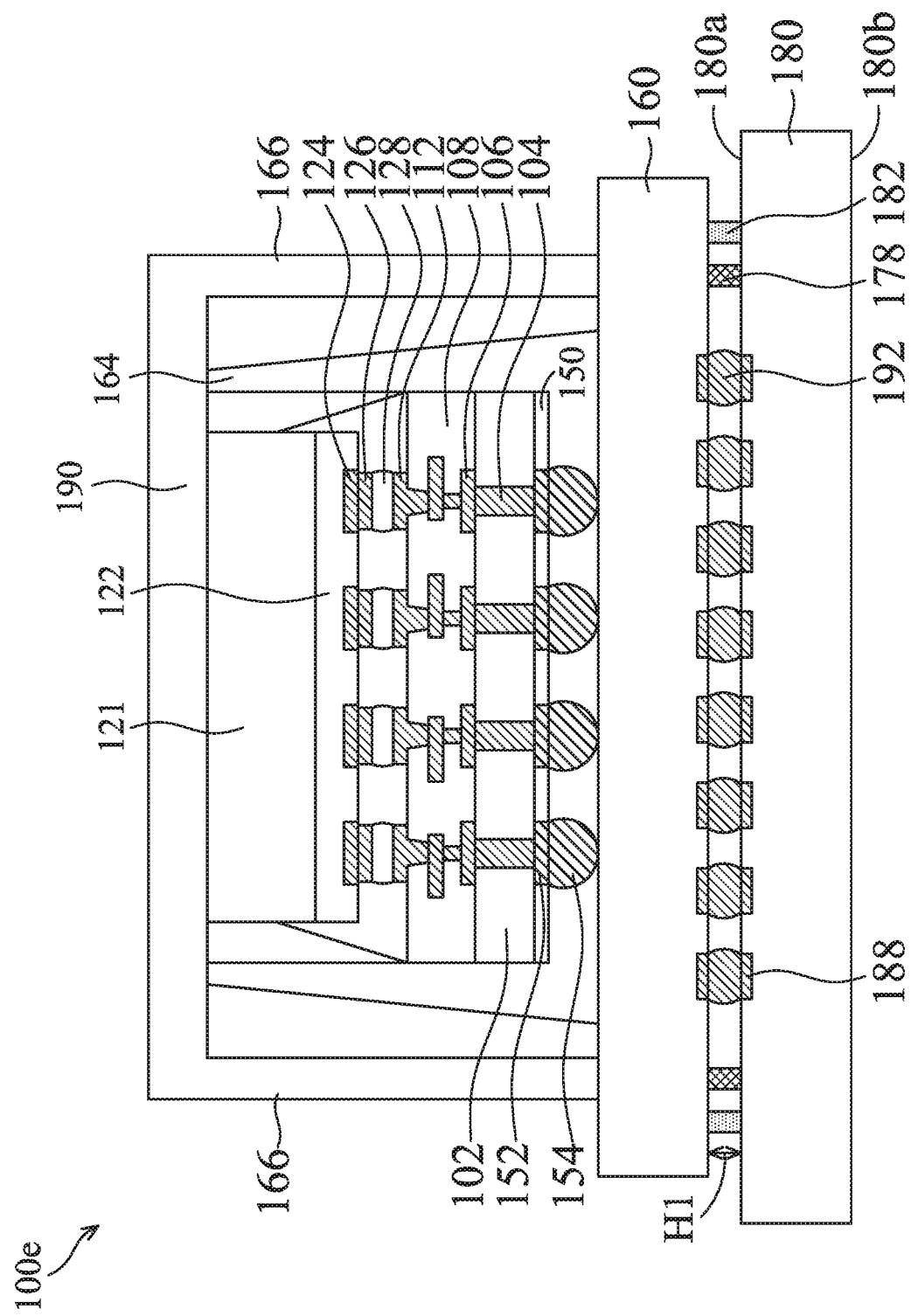
FIG. 5 shows a cross-sectional representation of a package structure, in accordance with some embodiments of the disclosure.

FIG. 5 shows a cross-sectional representation of a package structure 100e, in accordance with some embodiments of the disclosure. The package structure 100e is similar to, or the same as, the package structure 100a shown in FIG. 1M, except that a lid structure 190 is formed over the first surface 160a of the second substrate 160. Processes and materials used to form the package structure 100e may be similar to, or the same as, those used to form the package structure 100a and are not repeated herein.

As shown in FIG. 5, the lid structure 190 surrounds the die structure 10. Accordingly, the heat generated from the semiconductor die 120 may dissipate to the lid structure 172, and then dissipate to the external environment. The first protruding structure 178 is directly below the lid structure 190. The outer sidewall of the lid structure 190 is aligned with the outer sidewall of the first protruding structure 178.

Figure 6:
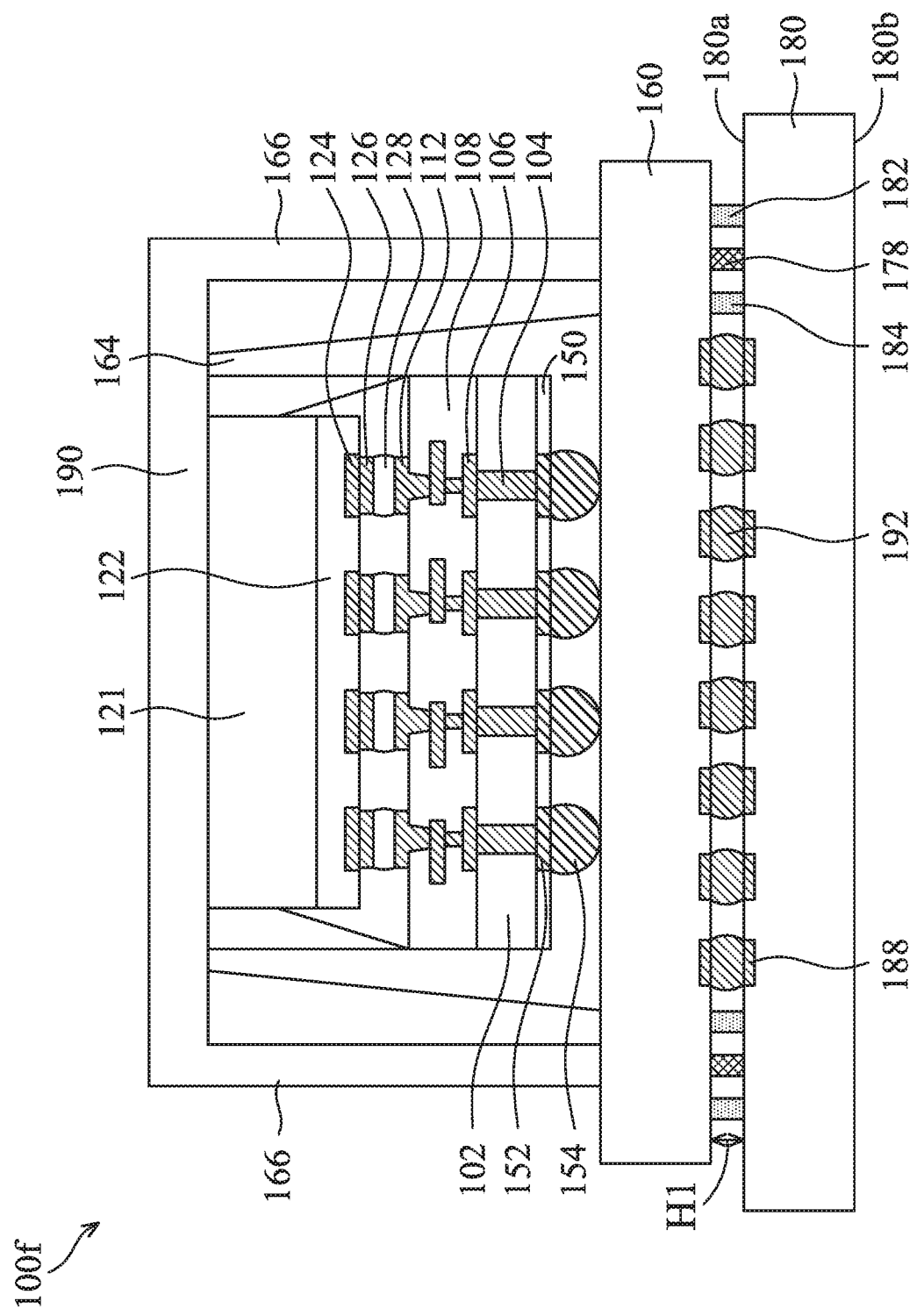
FIG. 6 shows a cross-sectional representation of a package structure, in accordance with some embodiments of the disclosure.

FIG. 6 shows a cross-sectional representation of a package structure 100f, in accordance with some embodiments of the disclosure. The package structure 100f is similar to, or the same as, the package structure 100a shown in FIG. 1M', except that the lid structure 190 is formed over the first surface 16a of the second substrate 160, and a fourth protruding structure 186 is formed between two adjacent electrical connectors 192. In some embodiments, the fourth protruding structure 186 may be initially formed below the second substrate 160, and then is bonded to the third substrate 180. In some other embodiments, the fourth protruding structure 186 may be initially formed on the third substrate 180, and then is bonded to the second substrate 160.

Figure 7:
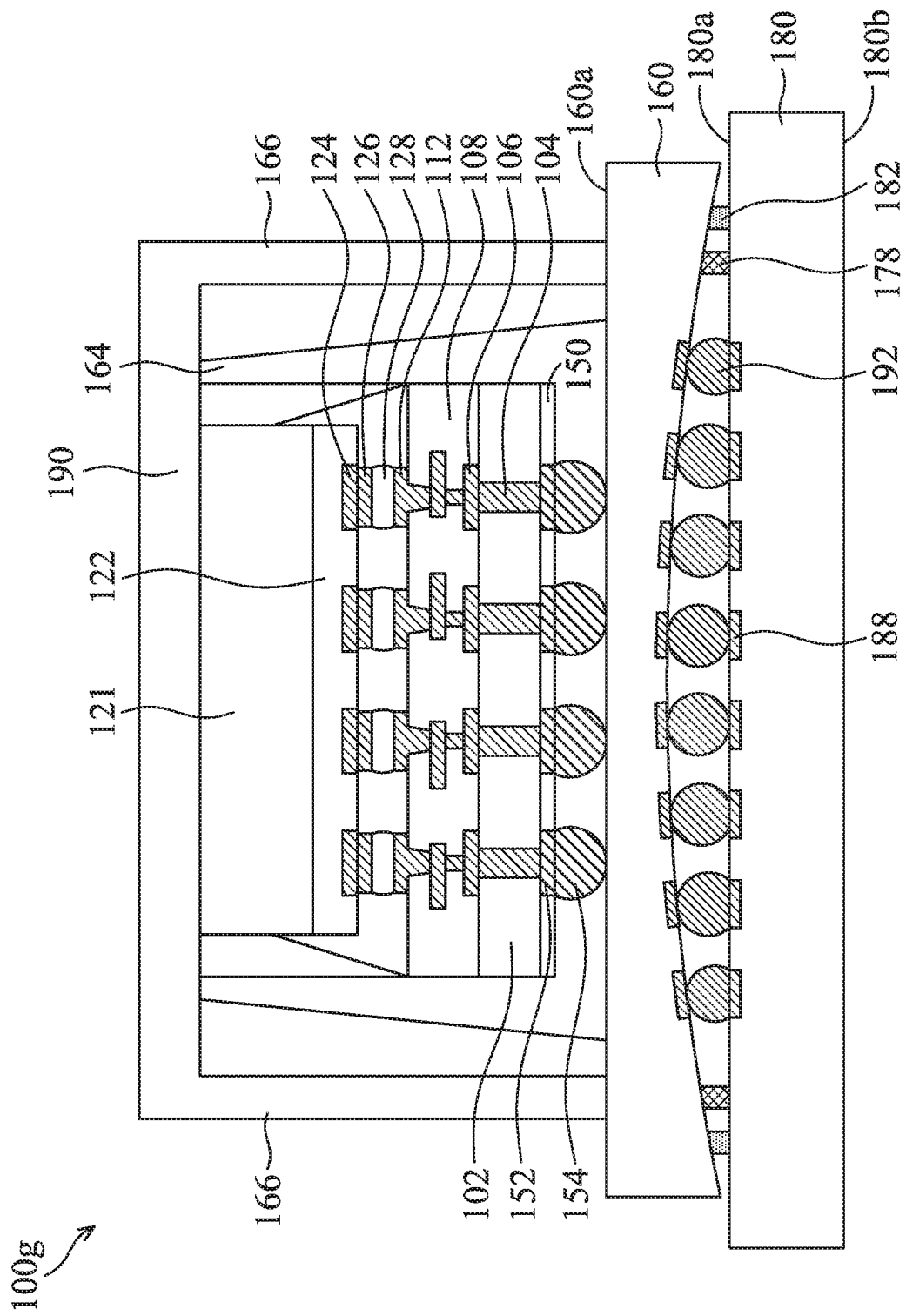
FIG. 7 shows a cross-sectional representation of a package structure, in accordance with some embodiments of the disclosure.

FIG. 7 shows a cross-sectional representation of a package structure 100g, in accordance with some embodiments of the disclosure. The package structure 100g is similar to, or the same as, the package structure 100c shown in FIG. 3E, except that a lid structure 190 is formed over the first surface 160a of the second substrate 160. Processes and materials used to form the package structure 100g may be similar to, or the same as, those used to form the package structure 100c and are not repeated herein.

Figure 8:
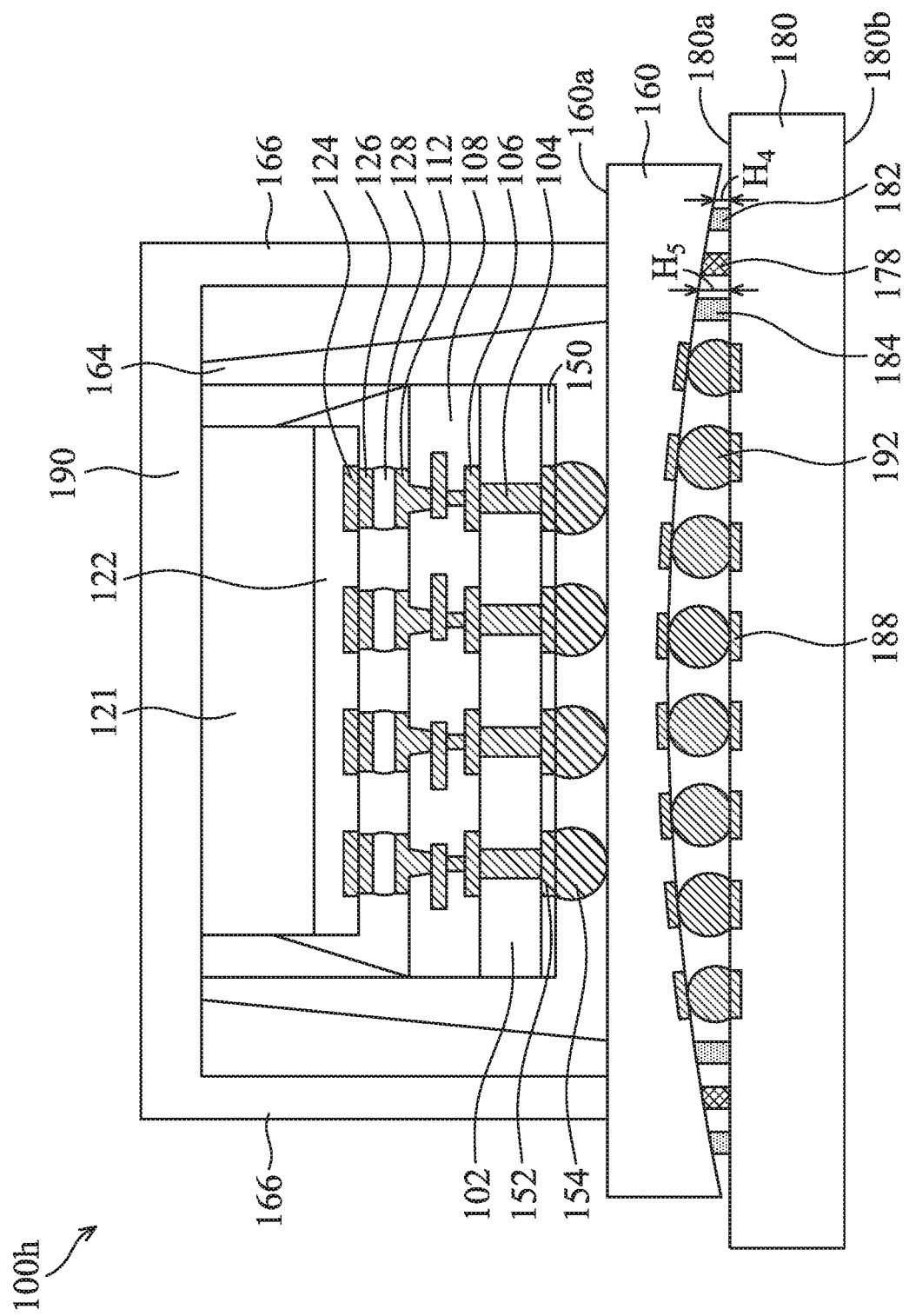
FIG. 8 shows a cross-sectional representation of a package structure, in accordance with some embodiments of the disclosure.

FIG. 8 shows a cross-sectional representation of a package structure 100h, in accordance with some embodiments of the disclosure. The package structure 100h is similar to, or the same as, the package structure 100d shown in FIG. 3E', except that the lid structure 190 is formed over the first surface 160a of the second substrate 160, and the fourth protruding structure 186 is formed between two adjacent electrical connectors 192. Processes and materials used to form the package structure 100h may be similar to, or the same as, those used to form the package structure 100d and are not repeated herein.

In some embodiments, the fourth protruding structure 186 may be initially formed below the second substrate 160, and then is bonded to the third substrate 180. In some other embodiments, the fourth protruding structure 186 may be initially formed on the third substrate 180, and then is bonded to the second substrate 160. In some embodiments, the sixth height $H_6$ of the fourth protruding structure 186 is greater than the fifth height $H_5$ of the third protruding structure 184.

The package structure 100a, 100b, 100c, 100d, 100e, 100f, 100g, 100h includes a die structure 10 formed over the first surface 160a of the second substrate 160. The first protruding structure 178 is formed below the second surface 160b of the second substrate 160 and adjacent to the electrical connectors 172. The second protruding structure 182 is formed over the third substrate 180. The first protruding structure 178 and the second protruding structure 182 are used to as a support and alignment mark. By using the first protruding structure 178 as the support, the warpage of the second substrate 160 is reduced. By using the first protruding structure 178 and the second protruding structure 182 as the alignment mark, the misalignment between the second substrate 160 and the third substrate 180 is reduced. In addition, the degree of non-planarity of the electrical connectors 172 is reduced by the pressing process 20, and the first protruding structure 178 is configured to control the height of the electrical connectors 172 when the pressing process 20 is performed on the electrical connectors 172.

Embodiments for forming a package structure and method for formation the same are provided. The package structure includes a die structure formed over a first surface of a second substrate, and the electrical connectors formed below a second surface of the second substrate. The first protruding structure and the electrical connectors are formed below the second substrate. The second protruding structure is formed over the third substrate. The first protruding structure and the second protruding structure are used to as a support, as a height controller, and as an alignment mark. Therefore, the bonding reliability and performance of the package structure are improved.

In some embodiments, a method for forming a package structure is provided. The method includes forming a die structure over a first surface of a first substrate, and forming a plurality of electrical connectors below a second surface of the first substrate. The method also includes forming a first protruding structure below the second surface of the first substrate, and the electrical connectors are surrounded by the first protruding structure. The method further includes forming a second protruding structure over a second substrate, and bonding the first substrate to the second substrate. The electrical connectors are surrounded by the second protruding structure, and the first protruding structure does not overlap with the second protruding structure.

In some embodiments, a method for forming a package structure is provided. The method includes forming a die structure over a first surface of a first substrate, and forming a plurality of electrical connectors below a second surface of the first substrate. The method also includes forming a first protruding structure next to the electrical connectors, and pressing a portion of the plurality of electrical connectors in a first region from the second surface of the first substrate, such that each of the electrical connectors in the first region has a substantially bottom flat surface. The method further includes forming a second protruding structure and a third protruding structure over a second substrate, and the second protruding structure and the third protruding structure are different heights. The method includes bonding the first substrate to the second substrate, and the first protruding structure is between the second protruding structure and the third protruding structure.

In some embodiments, a method for forming a package structure is provided. The method includes forming a die structure over a first substrate, and forming a plurality of electrical connectors below the first substrate. The method also includes forming a first supporting structure below the first substrate, and the first supporting structure has a first height. The method further includes performing a pressing process on the electrical connectors, such that the electrical connectors include a first group of pressed electrical connectors and a second group of un-pressed electrical connectors. The method further includes bonding the first substrate to a second substrate using the electrical connectors, and one of the first group of pressed electrical connectors has a second height. One of the second group of un-pressed electrical connectors has a third height. The first height is smaller than the second height, and the second height is smaller than the third height.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a package structure, comprising:
    forming a die structure over a first surface of a first substrate;
    forming a plurality of electrical connectors below a second surface of the first substrate;
    forming a first protruding structure below the second surface of the first substrate, wherein the electrical connectors are surrounded by the first protruding structure;
    forming a second protruding structure over a second substrate; and
    bonding the first substrate to the second substrate, wherein the electrical connectors are surrounded by the second protruding structure, and the first protruding structure does not overlap with the second protruding structure.

2. The method for forming the package structure as claimed in claim 1, further comprising:
    pressing a portion of the plurality of electrical connectors from the second surface of the first substrate before bonding the first substrate to the second substrate, so that the portion of electrical connectors has a substantially bottom flat surface.

3. The method for forming the package structure as claimed in claim 1, further comprising:
    forming a ring structure or a lid structure over the first surface of the first substrate, wherein the die structure is surrounded by the ring structure or the lid structure.

4. The method for forming the package structure as claimed in claim 3, wherein the first protruding structure is directly below the ring structure or the lid structure.

5. The method for forming the package structure as claimed in claim 1, wherein the first protruding structure and the second protruding structure are the same height.

6. The method for forming the package structure as claimed in claim 1, wherein the first protruding structure and the second protruding structure are both made of polymer material or metal.

7. The method for forming the package structure as claimed in claim 1, wherein the first protruding structure has an L-shape when seen from a top-view.

8. The method for forming the package structure as claimed in claim 1, wherein the first protruding structure has four sub-portions when seen from a top-view, and each of the sub-portions is located in a corner of the first substrate.

9. The method for forming the package structure as claimed in claim 1, wherein the die structure comprises:
 a plurality of through substrate vias (TSVs) formed in a third substrate;
 an interconnect structure formed over the TSVs; and
 a die formed over the interconnect structure.

10. A method for forming a package structure, comprising:
 forming a die structure over a first surface of a first substrate;
 forming a plurality of electrical connectors below a second surface of the first substrate;
 forming a first protruding structure next to the electrical connectors;
 pressing a portion of the plurality of electrical connectors in a first region from the second surface of the first substrate, such that each of the electrical connectors in the first region has a substantially bottom flat surface;
 forming a second protruding structure and a third protruding structure over a second substrate, wherein the second protruding structure and the third protruding structure are different heights; and
 bonding the first substrate to the second substrate, wherein the first protruding structure is between the second protruding structure and the third protruding structure.

11. The method for forming the package structure as claimed in claim 10, wherein the die structure comprises:
 a plurality of through substrate vias (TSVs) formed in a third substrate;
 an interconnect structure formed over the TSVs; and
 a die formed over the interconnect structure.

12. The method for forming the package structure as claimed in claim 10, wherein another portion of the plurality of electrical connectors in a second region is not pressed, and one of the electrical connectors in the first region has a first height which is smaller than a second height of one of the electrical connectors in the second region.

13. The method for forming the package structure as claimed in claim 12, wherein one of the electrical connectors in the first region has a first width which is greater than a second width of one of the electrical connectors in the second region.

14. The method for forming the package structure as claimed in claim 10, further comprising:
 forming a ring structure or a lid structure over the first surface of the first substrate, wherein the package structure is surrounded by the ring structure or the lid structure, and the first protruding structure is directly below the ring structure or the lid structure.

15. The method for forming the package structure as claimed in claim 12, wherein an outer sidewall of the ring structure or a lid structure is aligned with an outer sidewall of the first protruding structure.

16. A method for forming a package structure, comprising:
 forming a die structure over a first substrate;
 forming a plurality of electrical connectors below the first substrate;
 forming a first supporting structure below the first substrate, wherein the first supporting structure has a first height;
 performing a pressing process on the electrical connectors, such that the electrical connectors comprise a first group of pressed electrical connectors and a second group of un-pressed electrical connectors; and
 bonding the first substrate to a second substrate using the electrical connectors, wherein one of the first group of pressed electrical connectors has a second height, one of the second group of un-pressed electrical connectors has a third height, the first height is smaller than the second height, and the second height is smaller than the third height.

17. The method for forming the package structure as claimed in claim 16, further comprising:
 forming a second protruding structure over the second substrate before bonding the first substrate to the second substrate, wherein the second protruding structure is between the first substrate and the second substrate after bonding the first substrate to the second substrate.

18. The method for forming the package structure as claimed in claim 17, further comprising:
 forming a third protruding structure over the second substrate before bonding the first substrate to the second substrate, wherein the second protruding structure is between the first supporting structure and the third protruding structure.

19. The method for forming the package structure as claimed in claim 16, wherein the one of the first group of pressed electrical connectors has a second width, one of the second group of un-pressed electrical connectors has a third width, and the second width is greater than the third width.

20. The method for forming the package structure as claimed in claim 16, further comprising:
 forming a ring structure or a lid structure over the first surface of the first substrate, wherein the die structure is surrounded by the ring structure or the lid structure, and the first supporting structure is directly below the ring structure or the lid structure.

* * * * *